(12) United States Patent
Omizu

(10) Patent No.: US 12,137,556 B2
(45) Date of Patent: Nov. 5, 2024

(54) METHOD OF MANUFACTURING SEMICONDUCTOR DEVICE WITH IMPROVED GATE INSULATION STEP

(71) Applicant: RENESAS ELECTRONICS CORPORATION, Tokyo (JP)

(72) Inventor: Yuto Omizu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 429 days.

(21) Appl. No.: 17/500,297

(22) Filed: Oct. 13, 2021

(65) Prior Publication Data

US 2022/0123000 A1 Apr. 21, 2022

(30) Foreign Application Priority Data

Oct. 16, 2020 (JP) .................. 2020-174301

(51) Int. Cl.
*H10B 41/35* (2023.01)
*H01L 27/12* (2006.01)
*H10B 43/35* (2023.01)

(52) U.S. Cl.
CPC ......... *H10B 41/35* (2023.02); *H01L 27/1203* (2013.01); *H10B 43/35* (2023.02)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10;
(Continued)

(56) References Cited

U.S. PATENT DOCUMENTS 10,211,213 B2 *  2/2019  Mihara .................. H10B 43/00
10,411,121 B2    9/2019  Yamamoto
10,446,401 B2   10/2019  Makiyama
(Continued)

FOREIGN PATENT DOCUMENTS

JP    2019-079845 A    5/2019
JP    2019-102520 A    6/2019

*Primary Examiner* — Didarul A Mazumder
*Assistant Examiner* — Gustavo G Ramallo
(74) *Attorney, Agent, or Firm* — Rimon P.C.

(57) ABSTRACT

A first insulating film is formed on a semiconductor substrate in each of a first region in which a memory transistor is to be formed, a second region in which a selection transistor is to be formed, a third region in which a high-withstand-voltage transistor is to be formed, and a fourth region in which a low-withstand-voltage transistor is to be formed. Subsequently, the first insulating film in each of the first and second regions is removed. A second insulating film is formed on the semiconductor substrate in each of the first and second regions. A third insulating film having a trap level is formed on the second insulating film. The third insulating film in the second region and the second insulating film in the second region are removed. A fourth insulating film is formed on the third insulating film and on the semiconductor substrate in the second region.

8 Claims, 28 Drawing Sheets

(58) Field of Classification Search
CPC ........ H10B 51/20; H10B 51/30; H10B 51/40; H10B 51/50
See application file for complete search history.

(56) References Cited

U.S. PATENT DOCUMENTS

| | | | |
|---|---|---|---|
| 10,546,865 B2* | 1/2020 | Katou | H01L 29/792 |
| 2003/0030123 A1* | 2/2003 | Ichige | H01L 27/105 |
| | | | 257/500 |
| 2003/0198086 A1* | 10/2003 | Shukuri | H01L 29/4975 |
| | | | 257/E21.679 |
| 2005/0195630 A1* | 9/2005 | Arigane | H10B 41/35 |
| | | | 365/53 |
| 2007/0293029 A1* | 12/2007 | Ogawa | H10B 41/49 |
| | | | 257/E21.639 |
| 2010/0025754 A1* | 2/2010 | Shiba | H01L 29/40117 |
| | | | 257/326 |
| 2014/0179076 A1* | 6/2014 | Shinohara | H10B 43/40 |
| | | | 438/275 |
| 2014/0227839 A1* | 8/2014 | Shinohara | H01L 29/40117 |
| | | | 438/261 |
| 2014/0227843 A1* | 8/2014 | Tsukamoto | H01L 29/6659 |
| | | | 438/275 |
| 2016/0064507 A1* | 3/2016 | Amo | H10B 43/40 |
| | | | 257/314 |
| 2016/0086961 A1* | 3/2016 | Owada | H10B 41/41 |
| | | | 438/258 |
| 2016/0260795 A1* | 9/2016 | Abe | H10B 43/40 |
| 2017/0062445 A1* | 3/2017 | Yamashita | H01L 21/823431 |
| 2018/0047742 A1* | 2/2018 | Yamakoshi | H01L 29/40117 |
| 2019/0244968 A1* | 8/2019 | Abe | H10B 43/30 |

* cited by examiner

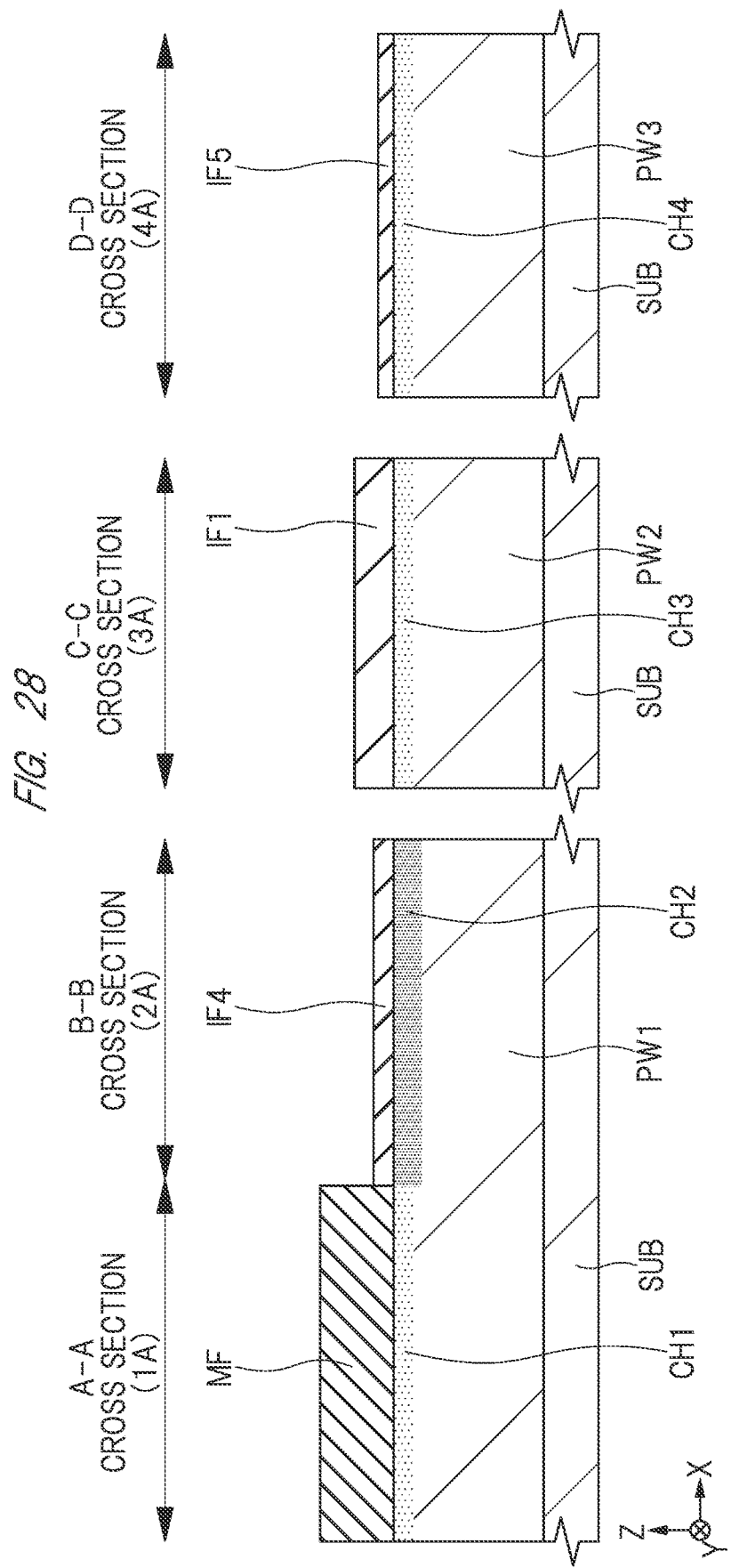

METHOD OF MANUFACTURING SEMICONDUCTOR DEVICE WITH IMPROVED GATE INSULATION STEP

CROSS-REFERENCE TO RELATED APPLICATIONS

The disclosure of Japanese Patent Application No. 2020-174301 filed on Oct. 16, 2020 including the specification, drawings and abstract is incorporated herein by reference in its entirety.

BACKGROUND

The present invention relates to a method of manufacturing a semiconductor device, and relates to, for example, a technology effectively applied to a semiconductor device having a non-volatile memory cell.

Flash memory and EEPROM (Electrically Erasable and Programmable Read Only Memory) have been widely used as electrically programmable and erasable non-volatile memory cells. These non-volatile memory cells have a floating gate electrode or a trap insulating film sandwiched between insulating films such as oxide films under a gate electrode of a field effect transistor, and the charge state accumulated in the floating gate electrode or the trap insulating film is used as memory information. This trap insulating film refers to an insulating layer in which electric charges can be accumulated, and an example thereof is a silicon nitride film. As such a non-volatile memory cell, a MONOS (Metal-Oxide-Nitride-Oxide-Semiconductor) transistor has been widely used.

Further, in the semiconductor device, other field effect transistors such as a high-withstand-voltage transistor and a low-withstand-voltage transistor are also provided in addition to the non-volatile memory cell. Since the thickness of the gate insulating film required for each of these field effect transistors differs, each of the gate insulating films needs to be formed separately.

For example, Patent Document 1 and Patent Document 2 disclose the technology of forming two types of transistors having different withstand voltages and a non-volatile memory cell having a MONOS memory transistor and a selection transistor on a semiconductor substrate.

Also, in Patent Document 1, a first gate insulating film for a high-withstand-voltage transistor is first formed, a second gate insulating film (ONO film) for a memory transistor is formed next, and then a third gate insulating film for a low-withstand-voltage transistor is formed as shown in FIG. 6 to FIG. 13 of Patent Document 1. Here, a gate insulating film for a selection transistor is formed in the same process as the gate insulating film for the high-withstand-voltage transistor.

On the other hand, Patent Document 2 discloses a manufacturing process different from that of Patent Document 1. Specifically, a second gate insulating film (ONO film) for a memory transistor is first formed, a first gate insulating film for a high-withstand-voltage transistor is formed next, and then a third gate insulating film for a low-withstand-voltage transistor is formed as shown in FIG. 18 to FIG. 23 of Patent Document 2. Here, a gate insulating film for a selection transistor is formed in the same process as the gate insulating film for the high-withstand-voltage transistor.

There are disclosed techniques listed below.
[Patent Document 1] Japanese Unexamined Patent Application Publication No. 2019-79845
[Patent Document 2] Japanese Unexamined Patent Application Publication No. 2019-102520

SUMMARY

In the case of the manufacturing process shown in Patent Document 1, a boundary portion between a memory transistor and a selection transistor is processed in the process of removing the first gate insulating film in the memory transistor forming region (FIG. 7 of Patent Document 1) and the process of removing the second gate insulating film in the selection transistor forming region (FIG. 10 of Patent Document 1).

However, since the margin for the misalignment of the mask is small in these processes, there is fear that the first gate insulating film is left in the memory transistor forming region or the second gate insulating film is left in the selection transistor forming region. Such a fear becomes more apparent as the miniaturization of the semiconductor device is promoted.

In order to resolve the fear and promote the miniaturization of the semiconductor device, it is necessary to precisely perform the processing of the boundary portion by using, for example, ArF excimer laser. However, the study by the inventors of this application has revealed the problem that the use of the ArF excimer laser needs the expensive exposure apparatus and the expensive exposure process.

In the case of the manufacturing process shown in Patent Document 2, the RTO (Rapid Thermal Oxidation) method is used for the process of forming the first insulating film, and the ISSG (In-Situ Steam Generation) oxidation method is used for the process of forming a top oxide film of the second insulating film (FIG. 21 of Patent Document 2).

However, the thickness of the first insulating film is larger than that of the top insulating film, and the oxidation temperature in the RTO method is higher than that in the ISSG oxidation method. Therefore, the thermal load is generated at the time of forming the first gate insulating film formed after the second gate insulating film, and this thermal load degrades the retention characteristics of the memory transistor. This problem has been revealed by the study by the inventors of this application.

In consideration of these problems, the main object of this application is to suppress the increase in the manufacturing cost of the semiconductor device and improve the reliability of the semiconductor device. Other problems and novel features will be apparent from the description of this specification and accompanying drawings.

According to an embodiment, a method of manufacturing a semiconductor device having a first region in which a memory transistor is to be formed, a second region in which a selection transistor for selecting the memory transistor is to be formed and which is adjacent to the first region, a third region in which a first field effect transistor is to be formed, and a fourth region in which a second field effect transistor is to be formed includes steps of: (a) forming a first insulating film on a semiconductor substrate in each of the first region, the second region, the third region and the fourth region; (b) after the (a), selectively removing the first insulating film in each of the first region and the second region; (c) after the (b), forming a second insulating film on the semiconductor substrate in each of the first region and the second region; (d) after the (c), forming a third insulating film having a trap level on the second insulating film in each of the first region and the second region and on the first insulating film in each of the third region and the fourth region; (e) after the (d), selectively removing the third film in the second region and the second insulating film in the second region; (f) after the (e), forming a fourth insulating film on the third insulating film in each of the first region, the third region and the fourth region and on the semiconductor substrate in the second region; (g) after the (f), selectively removing the fourth insulating film in each of the third region and the fourth region and the third insulating film in each of the third region and the fourth region; (h) after the (g), selectively removing the first insulating film in the fourth region; (i) after the (h) forming a fifth insulating film on the semiconductor substrate in the fourth region; and (j) after the (i) forming a first gate electrode of the memory transistor on the fourth insulating film in the first region, forming a second gate electrode of the selection transistor on the fourth insulating film in the second region, forming a third gate electrode of the first field effect transistor on the first insulating film in the third region, and forming a fourth gate electrode of the second field effect transistor on the fifth insulating film in the fourth region.

Further, according to an embodiment, a method of manufacturing a semiconductor device having a first region in which a memory transistor is to be formed, a second region in which a selection transistor for selecting the memory transistor to be formed and which is adjacent to the first region, a third region in which a first field effect transistor is to be formed, and a fourth region in which a second field effect transistor is to be formed includes steps of: (a) forming a first insulating film on a semiconductor substrate in each of the first region, the second region, the third region and the fourth region; (b) after the (a), selectively removing the first insulating film in each of the first region, the second region and the fourth region; (c) after the (b), forming a second insulating film on the semiconductor substrate in each of the first region, the second region and the fourth region; (d) after the (c) forming a third insulating film having a trap level on the second insulating film in each of the first region, the second region and the fourth region and on the first insulating film in the third region; (e) after the (d), selectively removing the third insulating film in the second region and the second insulating film in the second region; (f) after the (e), forming a fourth insulating film on the third insulating film in each of the first region, the third region and the fourth region and on the semiconductor substrate in the second region; (g) after the (f), selectively removing the fourth insulating film in each of the third region and the fourth region and the third insulating film in each of the third region and the fourth region; and (h) after the (g), forming a first gate electrode of the memory transistor on the fourth insulating film in the first region, forming a second gate electrode of the selection transistor on the fourth insulating film in the second region, forming a third gate electrode of the first field effect transistor on the first insulating film in the third region, and forming a fourth gate electrode of the second field effect transistor on the second insulating film in the fourth region.

According to an embodiment, it is possible to improve the reliability of the semiconductor device and suppress the increase in the manufacturing cost of the semiconductor device.

BRIEF DESCRIPTION OF THE DRAWINGS

FIG. 28 is a cross-sectional view showing a semiconductor device according to the second modification.

DETAILED DESCRIPTION

Figure 1:
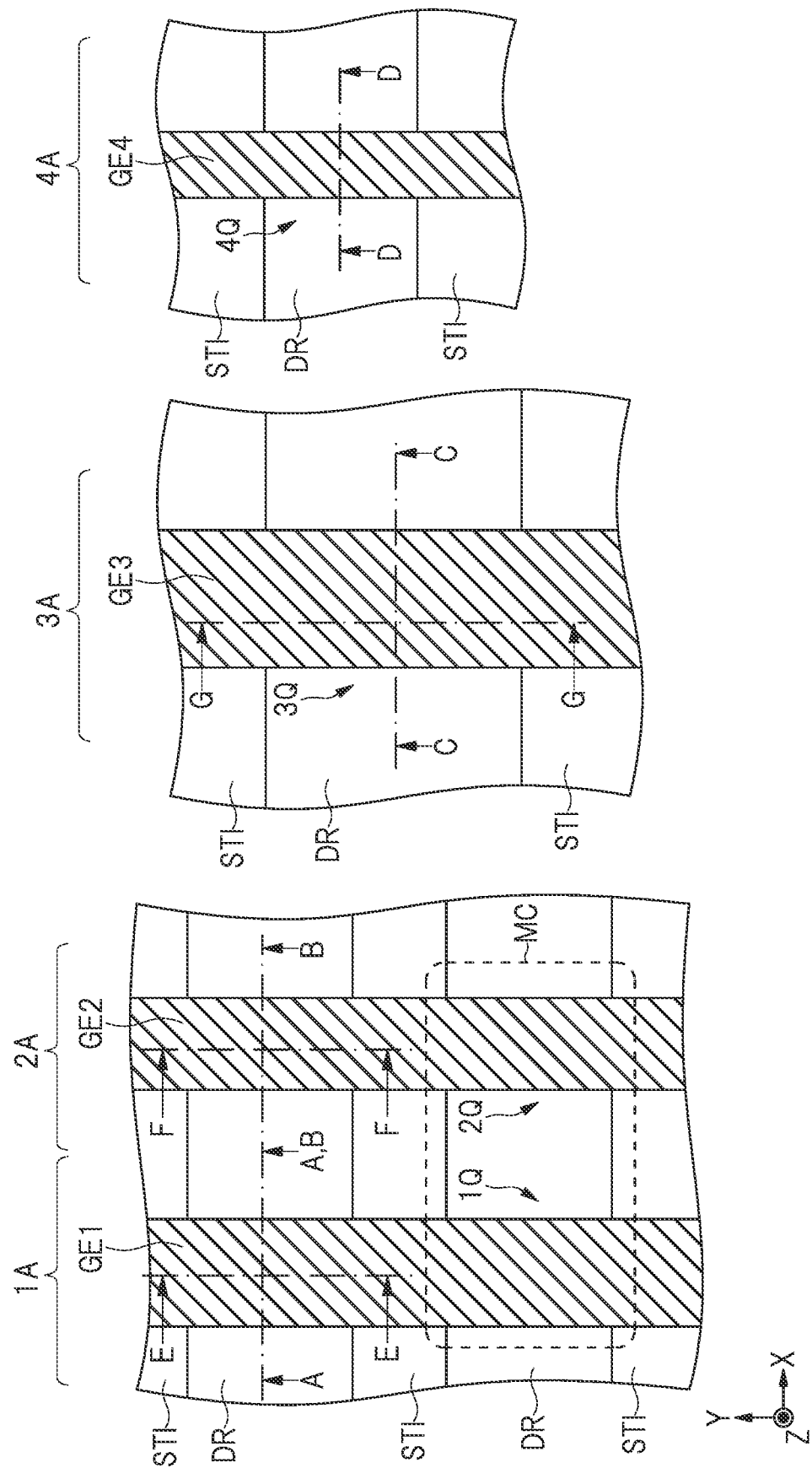
FIG. 1 is a simple plan view of a semiconductor device according to the first embodiment.

Hereinafter, embodiments will be described in detail with reference to the drawings. Note that members having the same function are denoted by the same reference characters throughout the drawings for describing the embodiments, and the repetitive description thereof will be omitted. In addition, the description of the same or similar portions is not repeated in principle unless particularly required in the following embodiments.

Also, in this application, hatching is omitted even in a cross-sectional view and hatching is used even in a plan view so as to make the drawings easy to see.

Further, the X direction, the Y direction and the Z direction in the description of this application orthogonally cross each other. In this application, the Z direction is described as a vertical direction, a height direction or a thickness direction of a certain structure in some cases.

First Embodiment

The semiconductor device and the method of manufacturing the same according to the first embodiment will be described below with reference to FIG. 1 to FIG. 16. First, the structure of the semiconductor device will be described with reference to FIG. 1 and FIG. 15, and then the method of manufacturing the semiconductor device will be described with reference to FIG. 2 to FIG. 15.

<Main Structure of Semiconductor Device>

FIG. 1 is a simple plan view of a semiconductor device according to the first embodiment. As shown in FIG. 1, the semiconductor device has a region 1A in which a memory transistor 1Q is to be formed, a region 2A in which a selection transistor 2Q for selecting the memory transistor 1Q is to be formed and which is adjacent to the region 1A, a region 3A in which a high-withstand-voltage transistor 3Q is to be formed, and a region 4A in which a low-withstand-voltage transistor 4Q is to be formed.

The regions 1A and 2A, the region 3A, and the region 4A are partitioned by an element isolation portion STI. Each of the transistors 1Q to 4Q is formed in an active region of the semiconductor substrate surrounded by the element isolation portion STI. In FIG. 1, a diffusion region DR composing a source region or a drain region of each of the transistors 1Q to 4Q is shown as part of the active region. Note that the element isolation portion STI is not provided between the region 1A and the region 2A and the diffusion region DR is formed. The memory transistor 1Q and the selection transistor 2Q are electrically connected by this diffusion region DR.

The memory transistor 1Q in the first embodiment is a MONOS transistor. A pair of the memory transistor 1Q and the selection transistor 2Q constitutes a non-volatile memory cell (memory cell) MC, and a plurality of memory cells MC is formed in the region 1A and the region 2A. A gate electrode GE1 of the memory transistor 1Q and a gate electrode GE2 of the selection transistor 2Q extend in the Y direction, and are used in common by the plurality of memory cells MC adjacent in the Y direction.

The high-withstand-voltage transistor 3Q is, for example, a field effect transistor composing part of an I/O (Input/Output) circuit. The low-withstand-voltage transistor 4Q is, for example, a field effect transistor composing a logic circuit including a CPU (Central Processing Unit) and an SRAM (Static Random Access Memory). The low-withstand-voltage transistor 4Q is driven by a voltage lower than that of the high-withstand-voltage transistor 3Q and has a gate insulating film thinner than a gate insulating film of the high-withstand-voltage transistor 3Q.

Also, in FIG. 1, a gate electrode GE3 of the high-withstand-voltage transistor 3Q and a gate electrode GE4 of the low-withstand-voltage transistor 4Q also extend in the Y direction, but the extending direction of these electrodes does not have to be the same as that of the gate electrode GE1 and the gate electrode GE2, and may be a different direction.

Note that each of the transistors 1Q to 4Q is an n type field effect transistor. Actually, a p type field effect transistor is also formed in the region 3A and the region 4A, but the description of the p type field effect transistor will be omitted in the following description.

Figure 15:
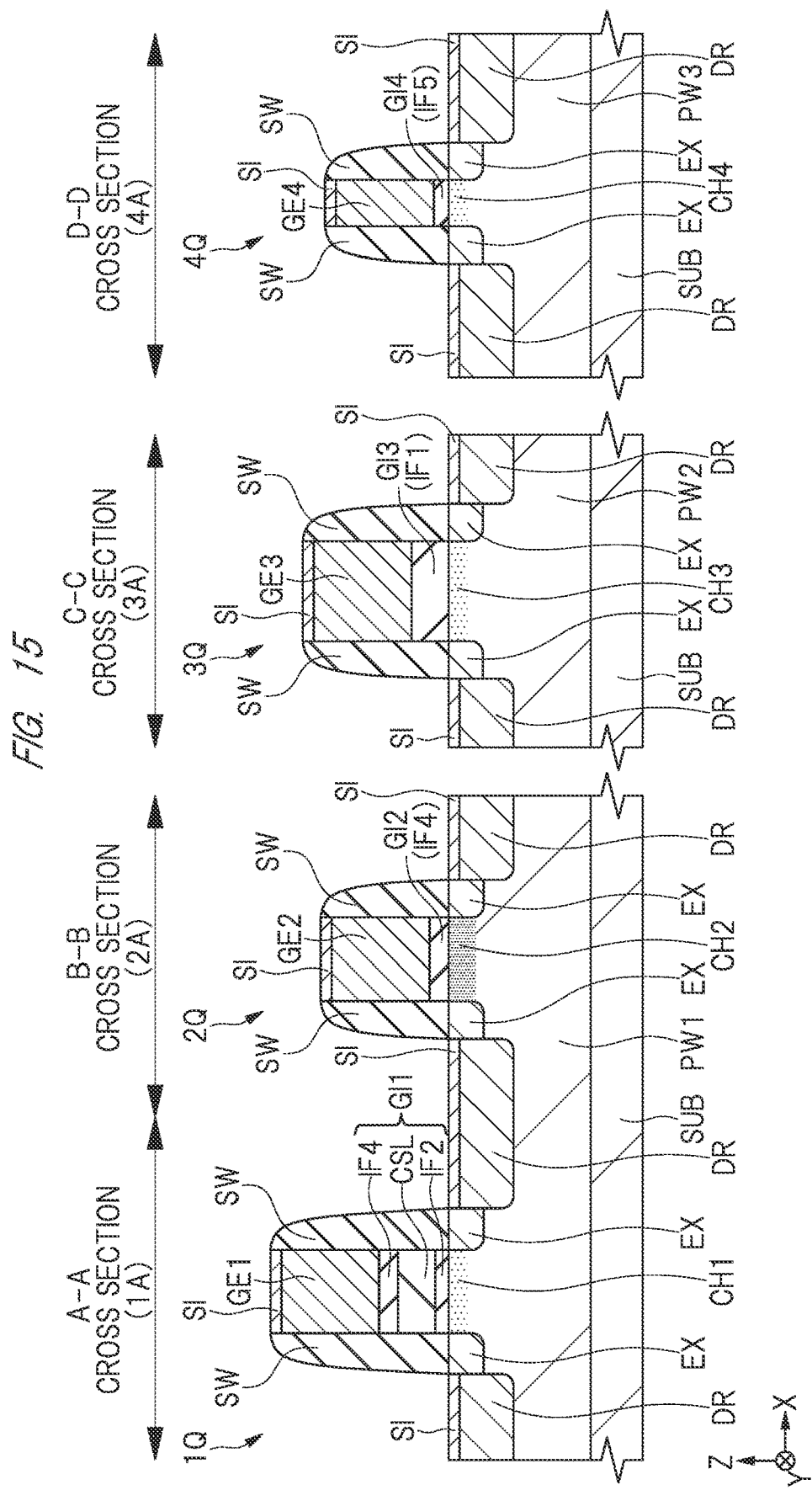
FIG. 15 is a cross-sectional view showing the process for manufacturing the semiconductor device subsequent to FIG. 14.

FIG. 15 shows a cross-sectional view in which the transistors 1Q to 4Q in the first embodiment are formed.

The memory transistor 1Q has a gate insulating film GI1, the gate electrode GE1 and a channel region CH1. The selection transistor 2Q has a gate insulating film GI2, the gate electrode GE2 and a channel region CH2. The high-withstand-voltage transistor 3Q has a gate insulating film GI3, a gate electrode GE3 and a channel region CH3. The low-withstand-voltage transistor 4Q has a gate insulating film GI4, a gate electrode GE4 and a channel region CH4.

Further, each of the transistors 1Q to 4Q has a sidewall spacer SW, an extension region (impurity region) EX, a diffusion region (impurity region) DR and a silicide layer SI.

The gate insulating film GI1 includes an insulating film IF2 formed on a semiconductor substrate SUB, an insulating film CSL formed on the insulating film IF2 and an insulating film IF4 formed on the insulating film CSL. The insulating film CSL is an insulating film having a trap level and functions as a charge storage layer of the memory transistor 1Q.

The gate insulating film GI2 includes the insulating film IF4 formed on the semiconductor substrate SUB. The gate insulating film GI3 includes an insulating film IF1 formed on the semiconductor substrate SUB. The gate insulating film GI4 includes an insulating film IF5 formed on the semiconductor substrate SUB.

Each of the gate electrodes GE1 to GE4 is formed on each of the gate insulating films GI1 to GI4. The sidewall spacer SW is formed on both side surfaces of each of the gate electrodes GE1 to GE4.

The extension region EX is formed in the semiconductor substrate SUB located on both sides of each of the gate electrodes GE1 to GE4, and the diffusion region DR is formed in the semiconductor substrate SUB located on both sides of each of the gate electrodes GE1 to GE4 via the sidewall spacer SW. The diffusion region DR has an impurity concentration higher than that of the extension region EX, and constitutes a source region or a drain region of each of the transistors 1Q to 4Q together with the extension region EX.

Each of the channel regions CH1 to CH4 is formed in the semiconductor substrate SUB located under each of the gate electrodes GE1 to GE4, and is formed between the extension regions EX of the regions 1A to 4A.

The silicide layer SI is formed on each upper surface of the gate electrodes GE1 to GE4 and the diffusion region DR.

The main feature of this application lies in the process for forming the gate insulating films GI1 to GI4. Hereinafter, the forming method of the configuration including each of the gate insulating films GI1 to GI4 and the thicknesses and materials of the gate insulating films GI1 to GI4 will be described.

<Method of Manufacturing Semiconductor Device>

Next, the method of manufacturing the semiconductor device according to the first embodiment will be described below with reference to FIG. 2 to FIG. 15. FIG. 2 to FIG. 15 show each cross-sectional view along the line A-A, the line B-B, the line C-C and the line D-D in FIG. 1, and show each manufacturing process for forming each of the transistors 1Q to 4Q.

Figure 2:
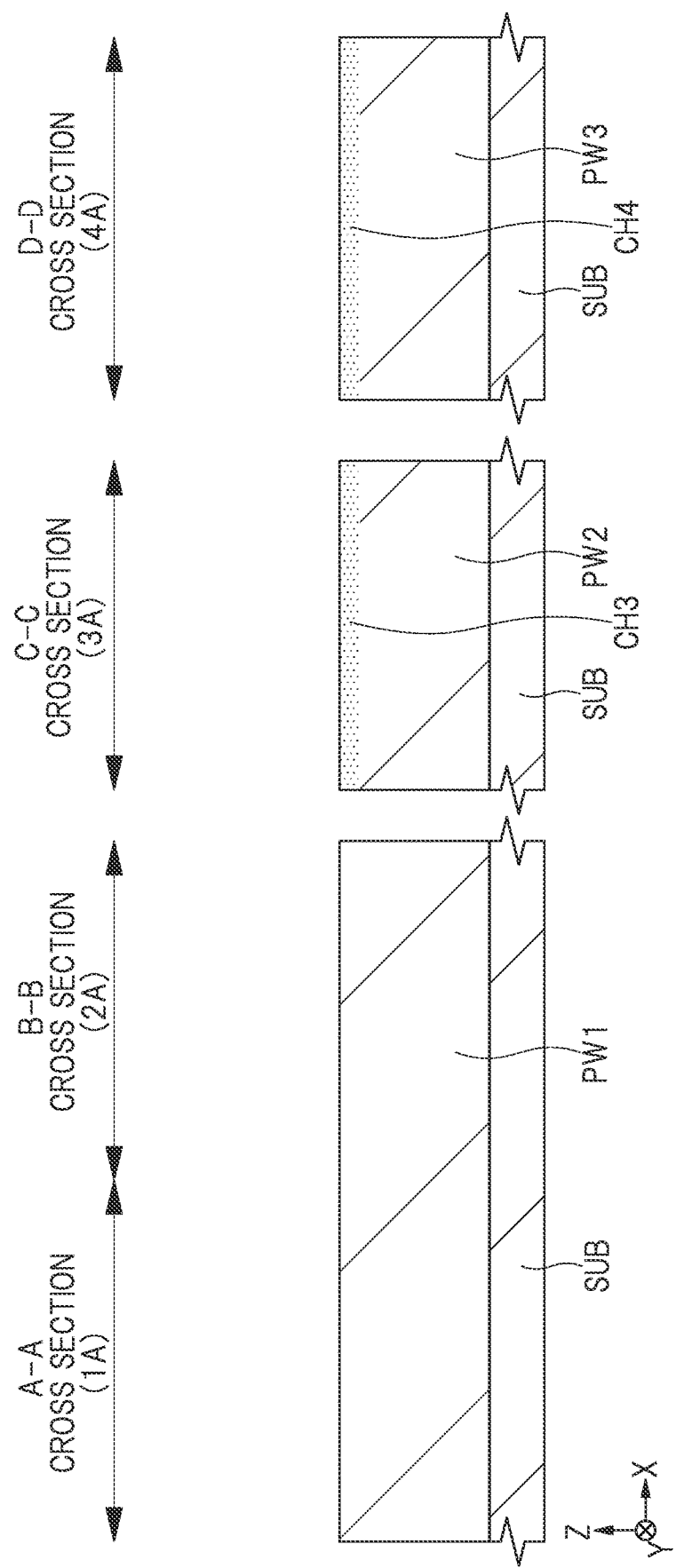
FIG. 2 is a cross-sectional view showing a process for manufacturing the semiconductor device according to the first embodiment.

First, as shown in FIG. 2, the semiconductor substrate SUB is prepared. The semiconductor substrate SUB is preferably made of single crystal silicon having a specific resistance of about 1 to 10 Ωm and is made of, for example, p type single crystal silicon. Next, though not shown here, the element isolation portion STI is formed by forming a trench in the semiconductor substrate SUB and filling the trench with an insulating film such as a silicon oxide film.

Next, p type well regions PW1 to PW3 are formed in the semiconductor substrate SUB by the photolithography technique and the ion implantation method. First, the well region PW1 is formed in the semiconductor substrate SUB in the region 1A and the region 2A. Next, the well region PW2 is formed in the semiconductor substrate SUB in the region 3A, and the channel region CH3 is subsequently formed in the surface of the well region PW2 by performing the ion implantation for adjusting the threshold of the high-withstand-voltage transistor 3Q. Then, the well region is formed in the semiconductor substrate SUB in the region 4A, and the channel region CH4 is subsequently formed in the surface of the well region PW3 by performing the ion implantation for adjusting the threshold of the low-withstand-voltage transistor 4Q.

Note that the order of forming each of the well regions PW1 to PW3 is not particularly limited, and any of the regions may be formed first.

Figure 3:
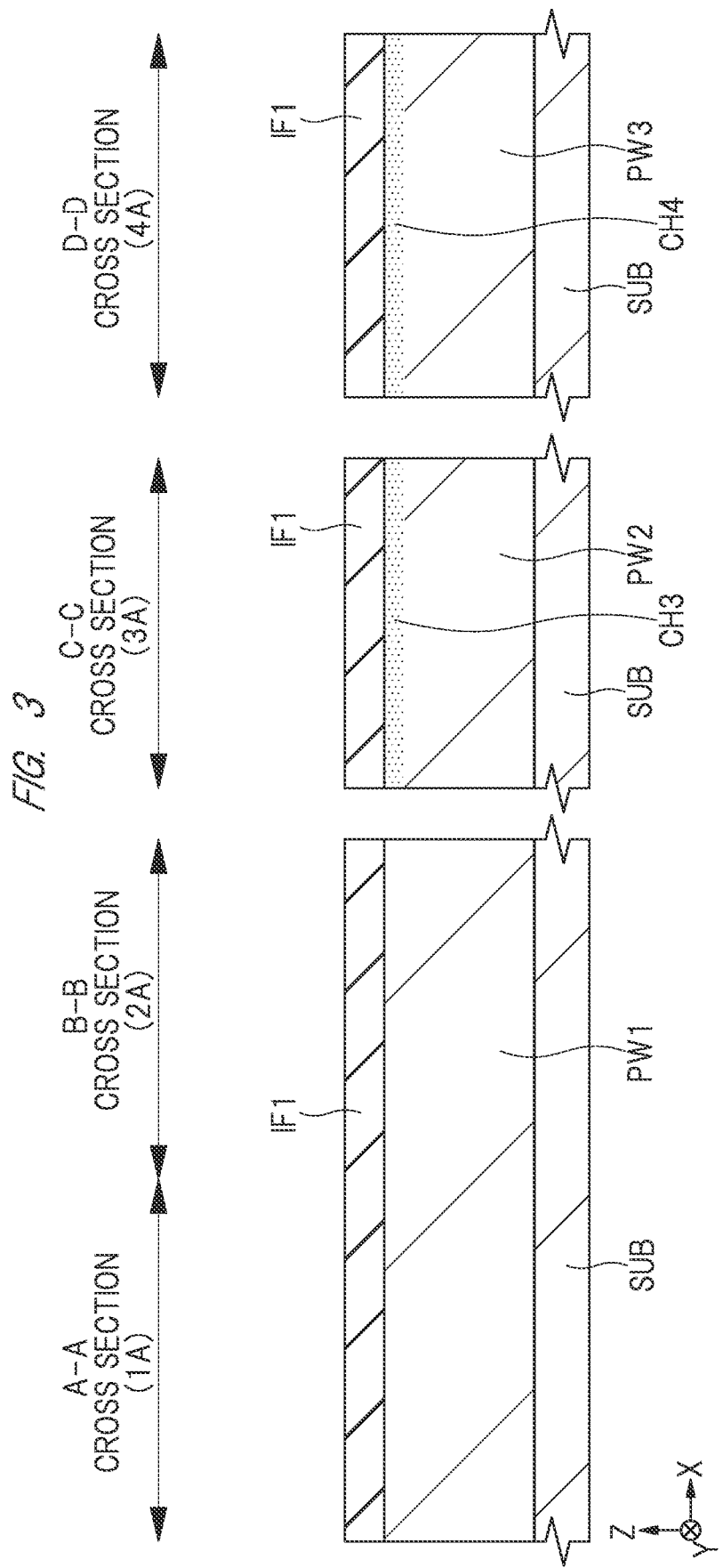
FIG. 3 is a cross-sectional view showing the process for manufacturing the semiconductor device subsequent to FIG. 2.

Next, as shown in FIG. 3, the insulating film IF1 made of, for example, silicon oxide is formed on the semiconductor substrate SUB by the RTO method. The thickness of the insulating film IF1 is, for example, 6 nm to 10 nm.

Note that the RTO method in the first embodiment is the method of forming a silicon oxide film by placing the semiconductor substrate SUB in a chamber of a heating apparatus and heating the semiconductor substrate SUB by irradiating the semiconductor substrate SUB with a large number of lamps while introducing oxygen gas into the chamber. The oxidation treatment for forming the insulating film IF1 is performed under the conditions of, for example, 1050° C. to 1100° C. and 10 to 20 seconds.

Further, when it is simply described as "by the thermal oxidation method" in the following description, the "thermal oxidation method" is the method generally referred to as dry oxidation or steam oxidation. These oxidation treatments are performed under the conditions of 800° C. to 950° C. and several minutes to several tens of minutes, though depending on the thickness of the insulating film to be formed.

Figure 4:
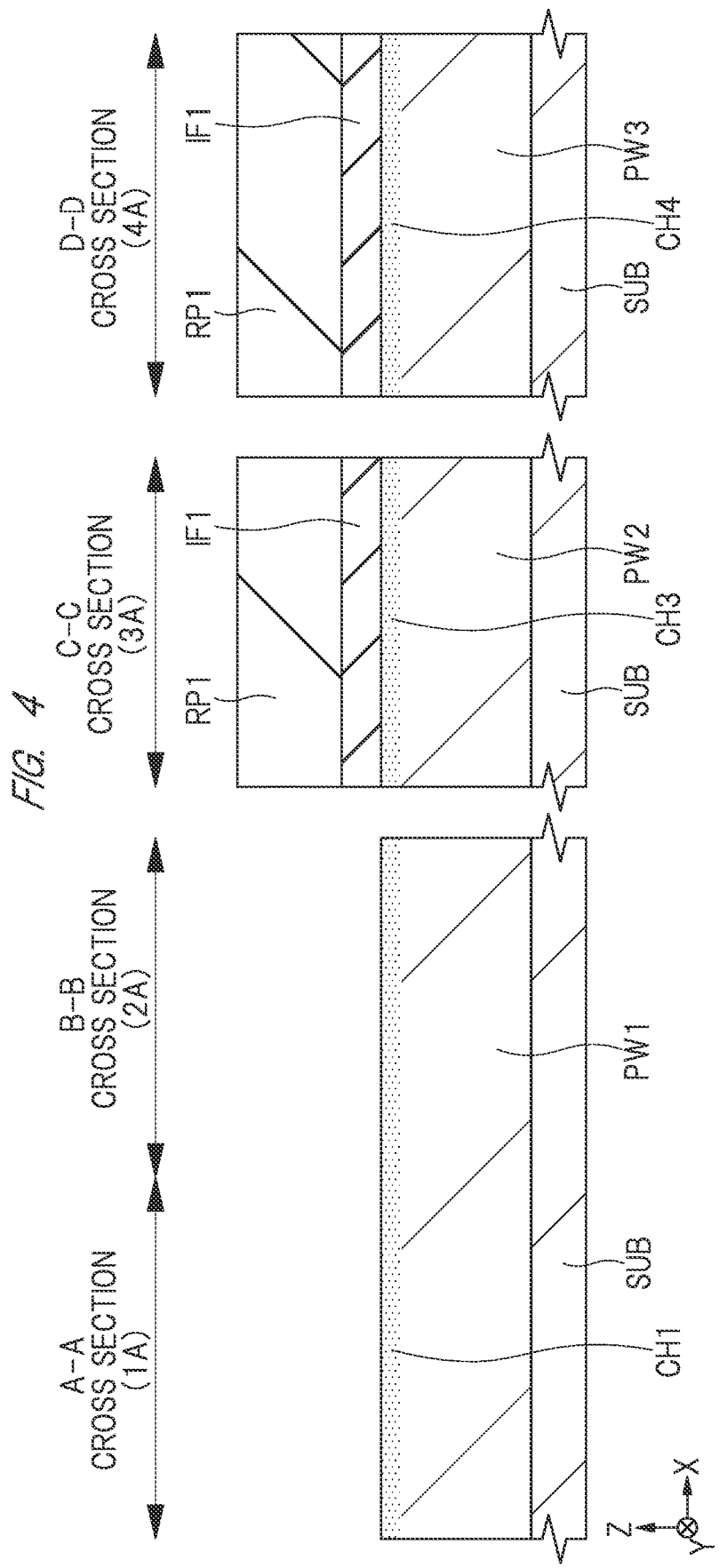
FIG. 4 is a cross-sectional view showing the process for manufacturing the semiconductor device subsequent to FIG. 3.

Next, as shown in FIG. 4, a resist pattern RP1 having an opening pattern exposing the region 1A and the region 2A so as to cover the region 3A and the region 4A is formed on the insulating film IF1. Next, ion implantation for adjusting the threshold of the memory transistor 1Q is performed using the resist pattern RP1 as a mask, thereby forming the channel region CH1 in the surface of the well region PW1 in each of the region 1A and the region 2A.

Next, the insulating film IF1 in the region 1A and the region 2A is selectively removed using the resist pattern RP1 as a mask by, for example, the wet etching process using a solution containing hydrofluoric acid. Thereafter, the resist pattern RP1 is removed by, for example, the ashing treatment.

Here, since the resist pattern RP1 can be used in both the process of forming the channel region CH1 and the process of removing the insulating film IF1, the number of masks can be reduced.

Figure 5:
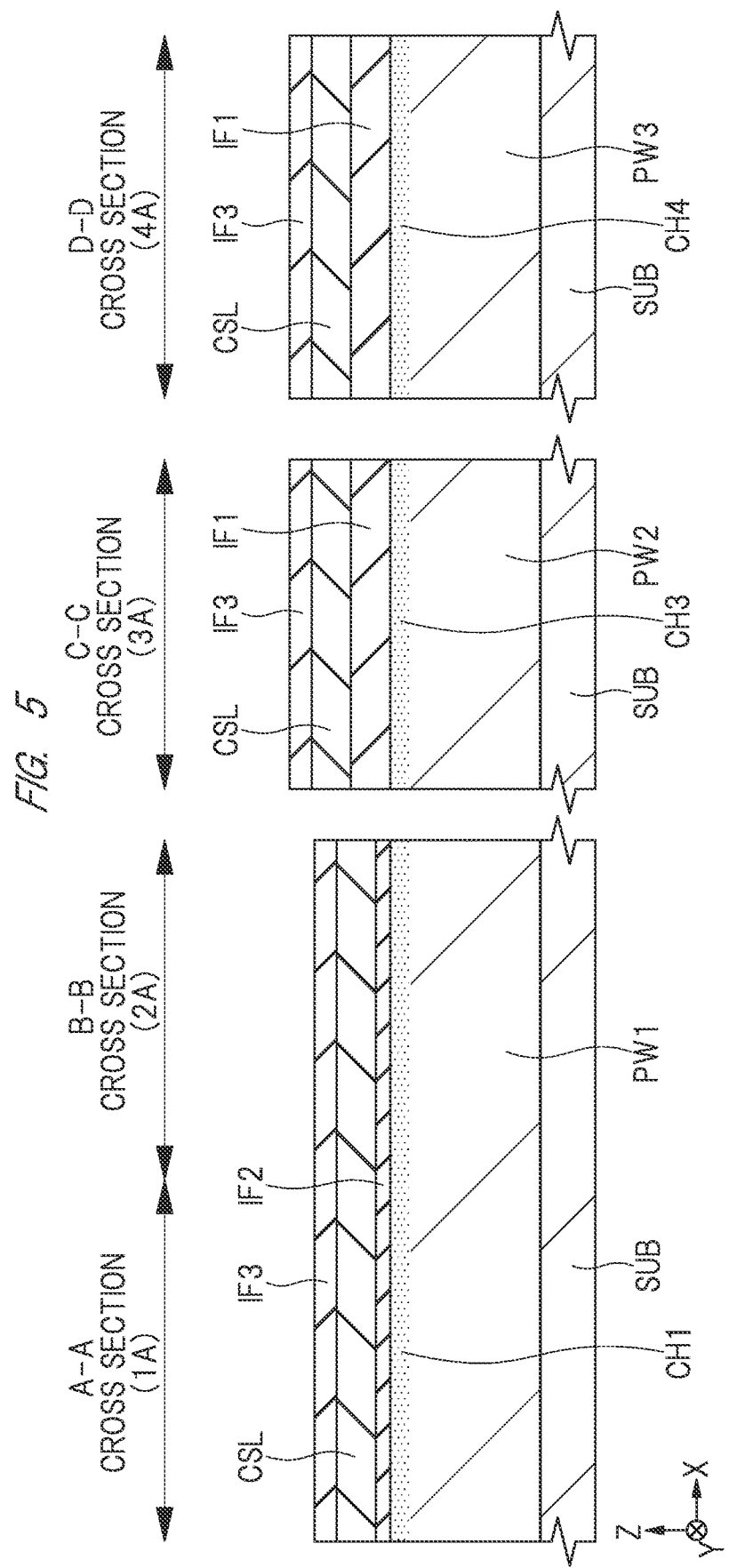
FIG. 5 is a cross-sectional view showing the process for manufacturing the semiconductor device subsequent to FIG. 4.

Next, as shown in FIG. 5, the insulating film IF2 made of, for example, silicon oxide is formed on the semiconductor substrate SUB in each of the region 1A and the region 2A by, for example, the thermal oxidation method. The thickness of the insulating film IF2 is, for example, 1 nm to 3 nm. By this oxidation treatment, the semiconductor substrate SUB in the region 3A and the region 4A is slightly oxidized and the thickness of the insulating film IF1 slightly increases.

Next, the insulating film CSL made of, for example, silicon nitride is formed on the insulating film IF2 in each of the region 1A and the region 2A and on the insulating film IF1 in each of the region 3A and the region 4A by, for example, the CVD (Chemical Vapor Deposition) method or the ALD (Atomic Layer Deposition) method. The thickness of the insulating film CSL is, for example, 7 nm to 10 nm.

Next, an insulating film IF3 made of, for example, silicon oxide is formed on the insulating film CSL in each of the regions 1A to 4A by, for example, the CVD method. The thickness of the insulating film IF3 is, for example, 4 nm to 6 nm. The insulating film IF3 is formed so as to function mainly as a protective film (mask) for protecting each insulating film formed below the insulating film IF3 when removing the insulating film CSL in the subsequent manufacturing process.

Figure 6:
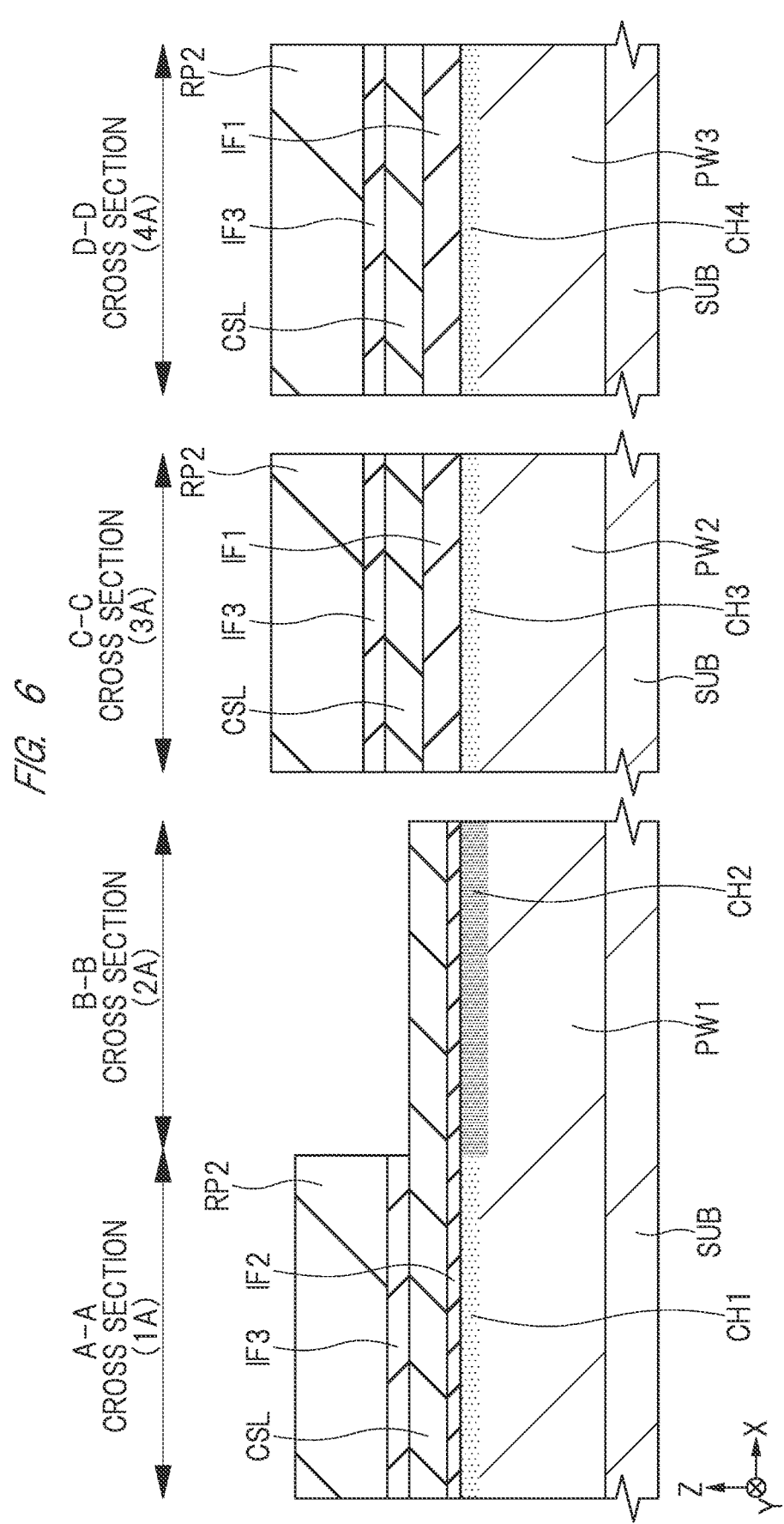
FIG. 6 is a cross-sectional view showing the process for manufacturing the semiconductor device subsequent to FIG. 5.

Next, as shown in FIG. 6, a resist pattern RP2 having an opening pattern exposing the region 2A so as to cover the region 1A, the region 3A and the region 4A is formed on the insulating film IF3. Next, ion implantation for adjusting the threshold of the selection transistor 2Q is performed using the resist pattern RP2 as a mask, thereby forming the channel region CH2 in the surface of the well region PW1 in the region 2A.

Next, the insulating film IF3 in the region 2A is selectively removed using the resist pattern RP2 as a mask by, for example, the wet etching process using a solution containing hydrofluoric acid. Thereafter, the resist pattern RP2 is removed by, for example, the asking treatment.

Here, since the resist pattern RP2 can be used in both the process of forming the channel region CH2 and the process of removing the insulating film IF3, the number of masks can be reduced. Note that either the process of forming the channel region CH2 or the process of removing the insulating film IF3 may be performed first.

Figure 7:
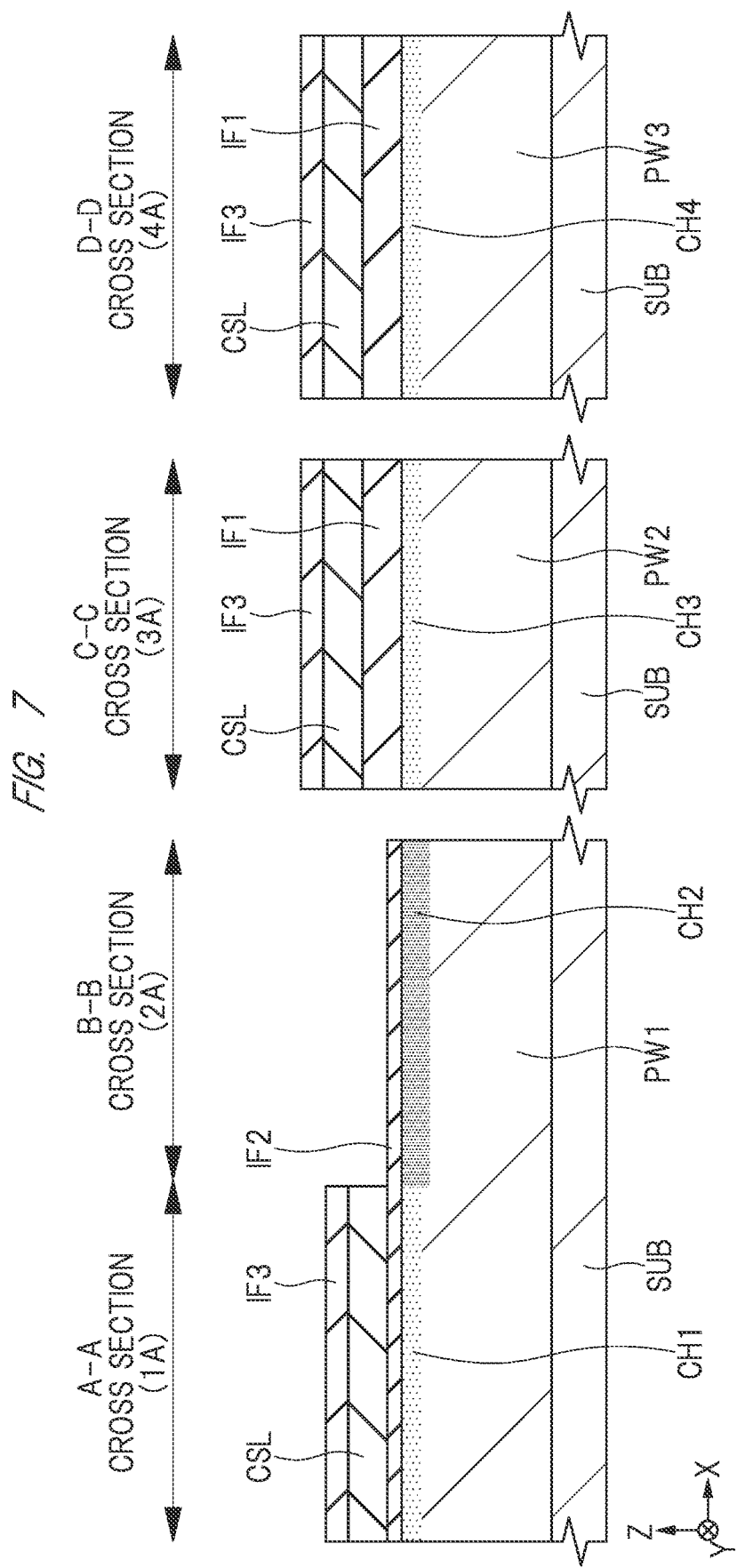
FIG. 7 is a cross-sectional view showing the process for manufacturing the semiconductor device subsequent to FIG. 6.

Next, as shown in FIG. 7, the insulating film CSL in the region 2A is selectively removed using the insulating film IF3 in the region 1A, the region 3A and the region 4A as a mask by, for example, the wet etching process using a solution containing phosphoric acid.

Figure 8:
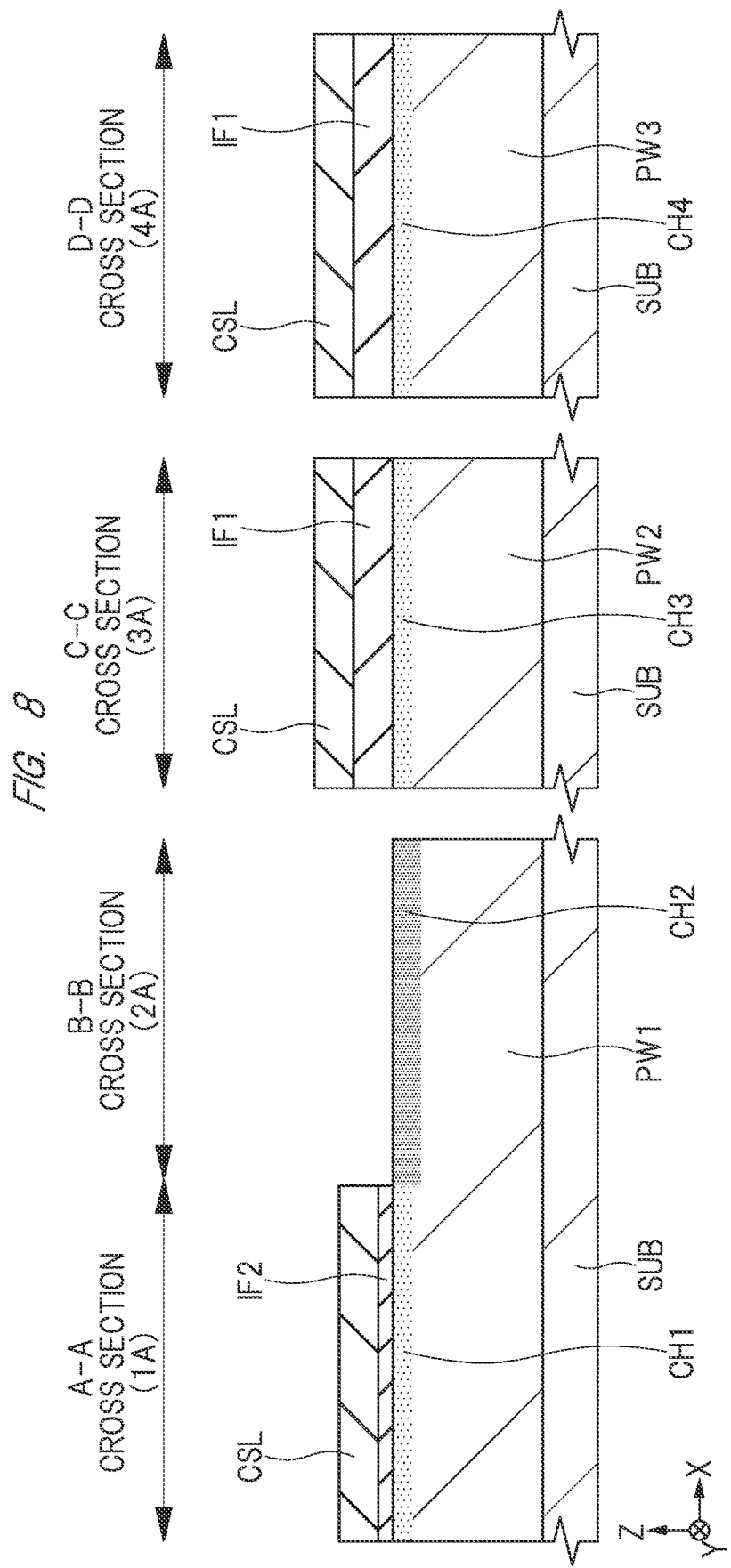
FIG. 8 is a cross-sectional view showing the process for manufacturing the semiconductor device subsequent to FIG. 7.

Next, as shown in FIG. 8, the insulating film IF2 in the region 2A is selectively removed by, for example, the wet etching process using a solution containing hydrofluoric acid. At this time, the insulating film IF3 in the region 1A, the region 3A and the region 4A is also removed.

Figure 9:
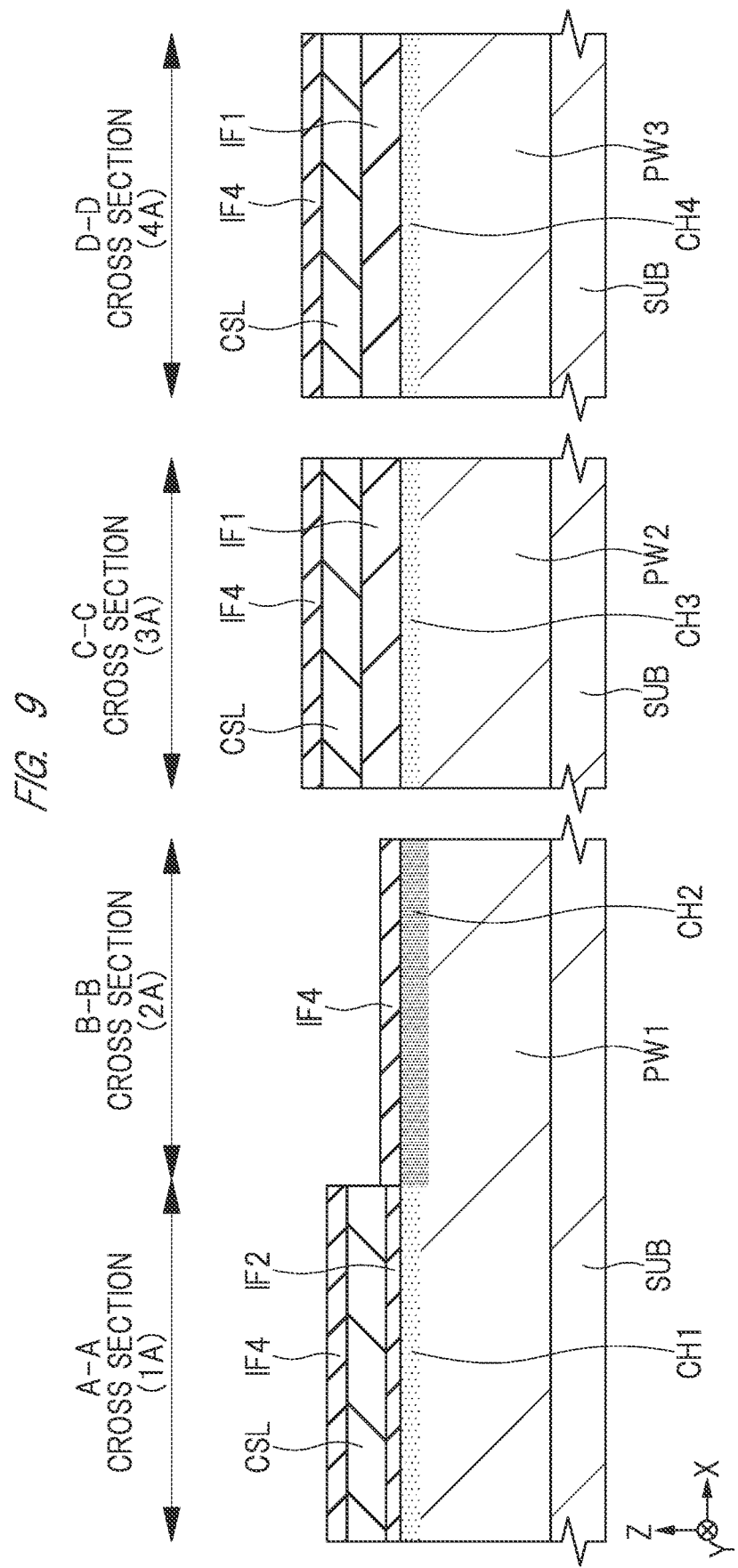
FIG. 9 is a cross-sectional view showing the process for manufacturing the semiconductor device subsequent to FIG. 8.

Next, as shown in FIG. 9, the insulating film IF4 is formed on the insulating film CSL in each of the region 1A, the region 3A and the region 4A and on the semiconductor substrate SUB in the region 2A by, for example, the ISSG oxidation method. The thickness of the insulating film IF4 is, for example, 4 nm to 5 nm.

Note that the ISSG oxidation method in the first embodiment is the method of forming a silicon oxide film by placing the semiconductor substrate SUB in the chamber of the heating apparatus, directly introducing hydrogen and oxygen into the chamber, and generating water vapor on the heated semiconductor substrate SUB to cause the radical oxidation reaction. The oxidation treatment for forming the insulating film IF4 is performed under the conditions for example, 900° C. and the hydrogen concentration of 10% or more.

Further, in the ISSG oxidation method, not only the surface of the semiconductor substrate SUB made of silicon but also the surface of the insulating film CSL made of silicon nitride can be oxidized. Since the oxidation rates of these are slightly different, the thickness of the insulating film IF4 in the region 2A is larger than the thickness of the insulating film IF4 in each of the region 1A, the region 3A and the region 4A.

Figure 10:
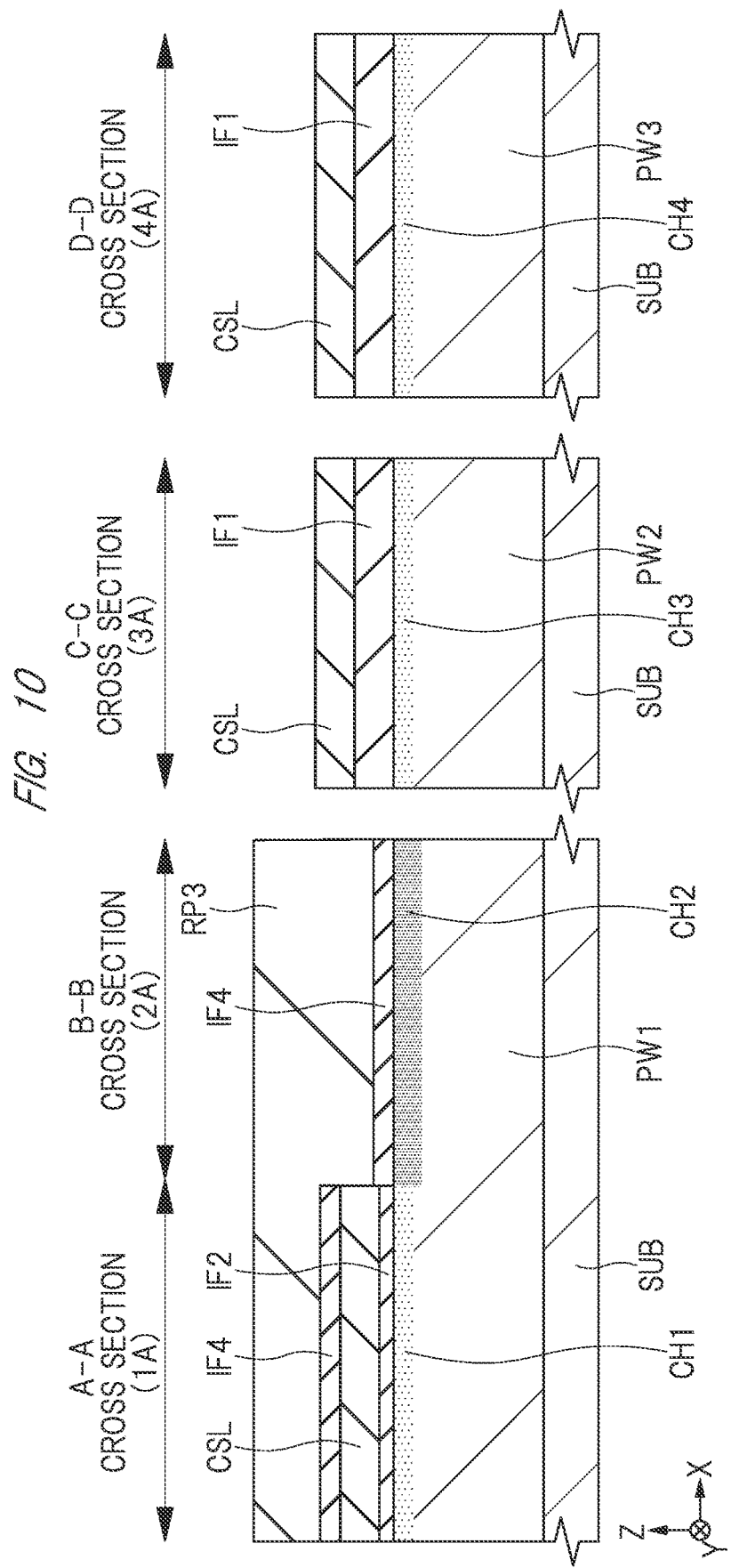
FIG. 10 is a cross-sectional view showing the process for manufacturing the semiconductor device subsequent to FIG. 9.

Next, as shown in FIG. 10, a resist pattern RP3 having an opening pattern exposing the region 3A and the region 4A so as to cover the region 1A and the region 2A is formed on the insulating film IF4.

Next, the insulating film IF4 in the region 3A and the region is selectively removed using the resist pattern RP3 as a mask by, for example, the wet etching process using a solution containing hydrofluoric acid. Then, the resist pattern RP3 is removed by, for example, the ashing treatment.

Figure 11:
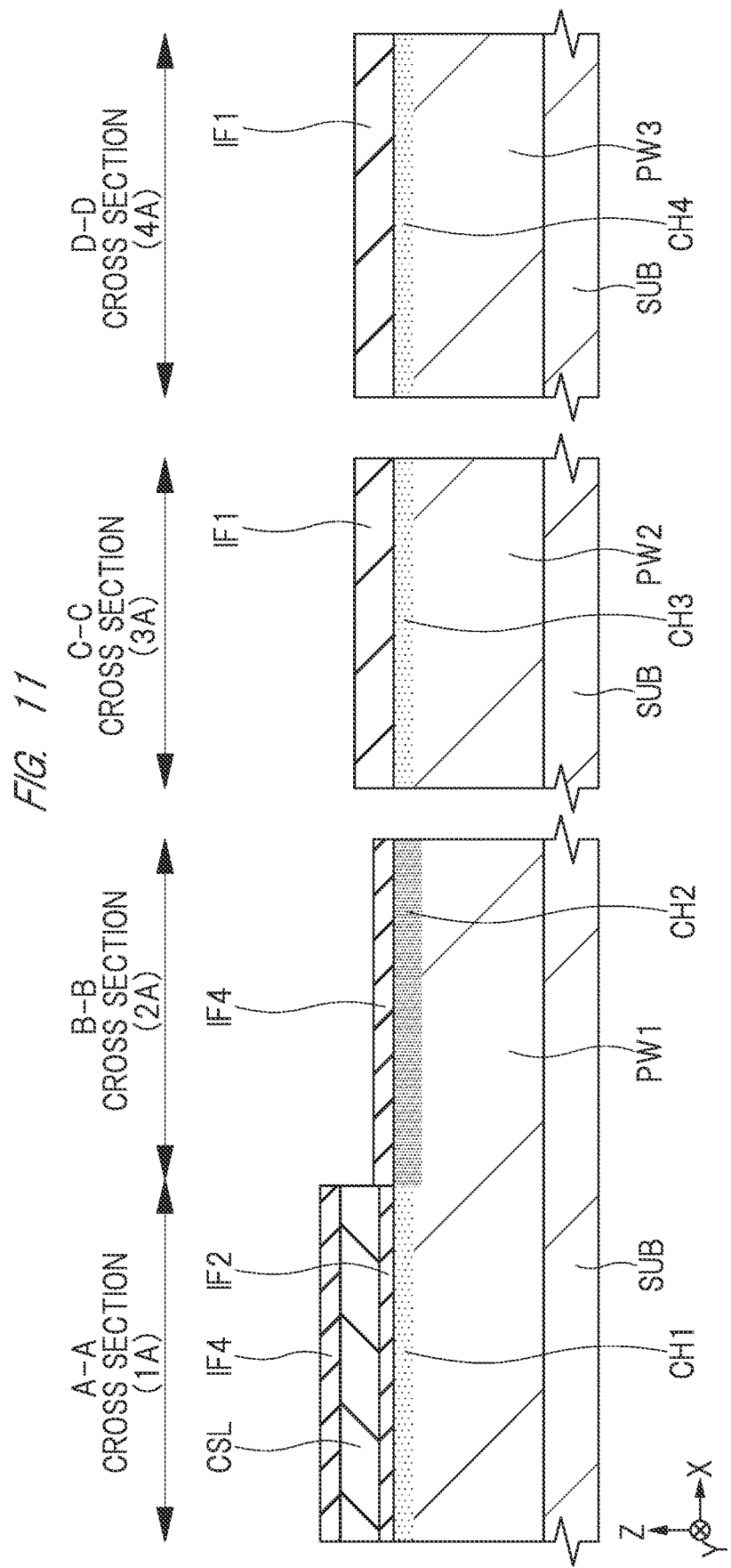
FIG. 11 is a cross-sectional view showing the process for manufacturing the semiconductor device subsequent to FIG. 10.

Next, as shown in FIG. 11, the insulating film CSL in the region 3A and the region 4A is selectively removed using the insulating film IF4 in the region 1A and the region 2A as a mask by, for example, the wet etching process using a solution containing phosphoric acid.

Figure 12:
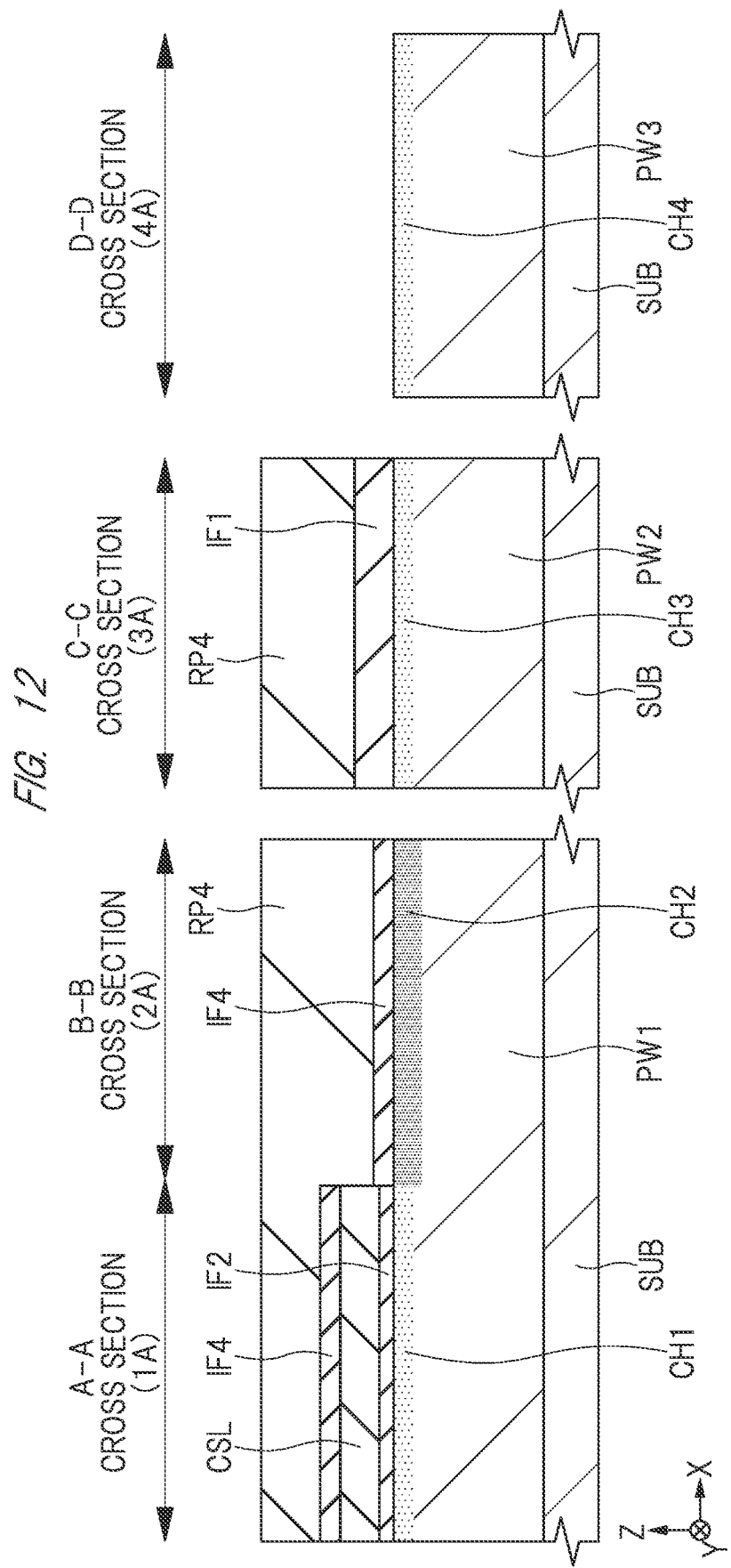
FIG. 12 is a cross-sectional view showing the process for manufacturing the semiconductor device subsequent to FIG. 11.

Next, as shown in FIG. 12, a resist pattern RP4 having an opening pattern exposing the region 4A so as to cover the regions 1A to 3A is formed.

Next, the insulating film IF1 in the region 4A is selectively removed using the resist pattern RP4 as a mask by, for example, the wet etching process using a solution containing hydrofluoric acid. Then, the resist pattern RP4 is removed by, for example, the ashing treatment.

Figure 13:
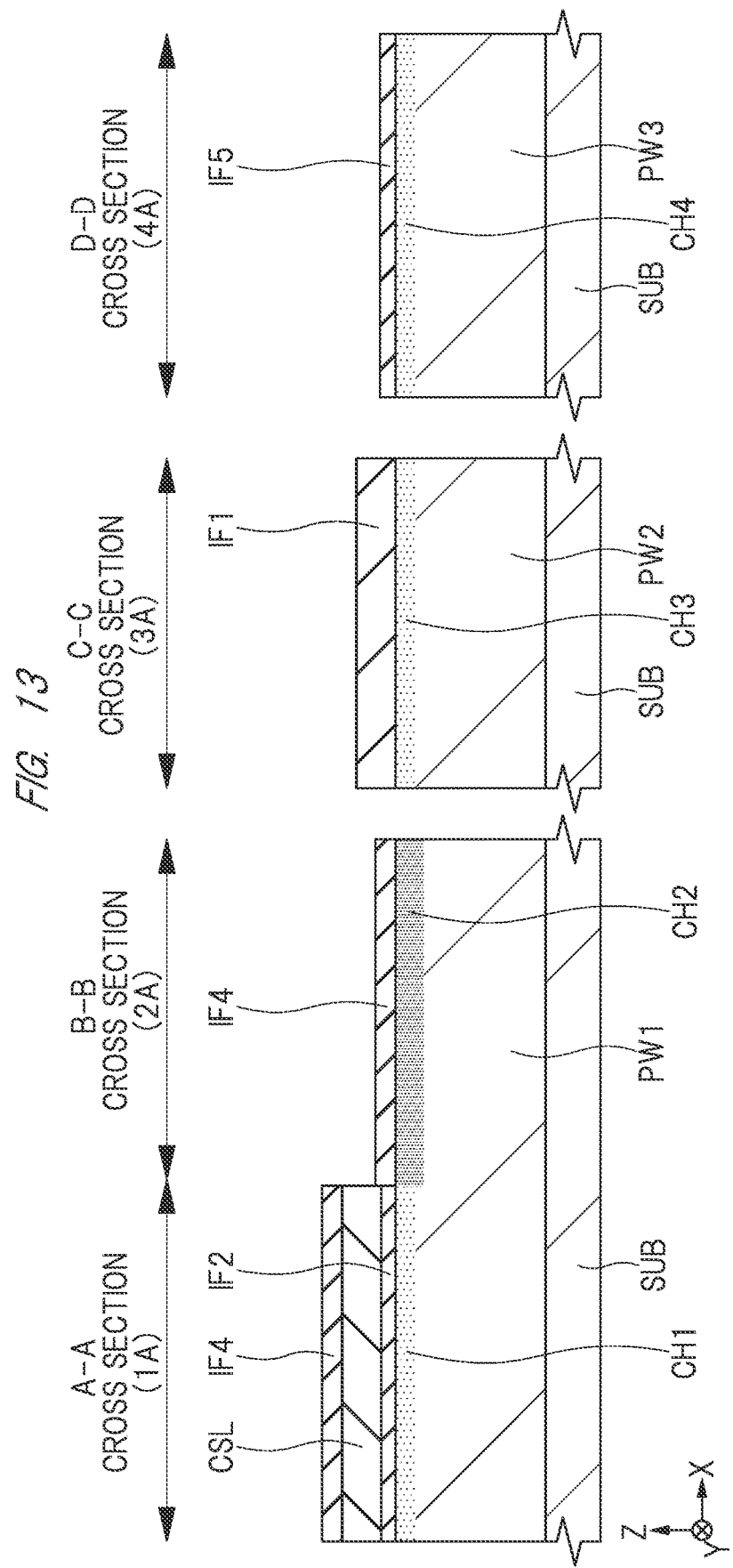
FIG. 13 is a cross-sectional view showing the process for manufacturing the semiconductor device subsequent to FIG. 12.

Next, as shown in FIG. 13, the insulating film IF5 made of, for example, silicon oxide is formed on the semiconductor substrate SUB in the region 4A by, for example, the thermal oxidation method. The thickness of the insulating film IF5 is, for example, 1 nm to 3 nm. By this oxidation treatment, the thickness of the insulating film IF4 in the region 2A and the thickness of the insulating film IF1 in the region 3A slightly increase.

Figure 14:
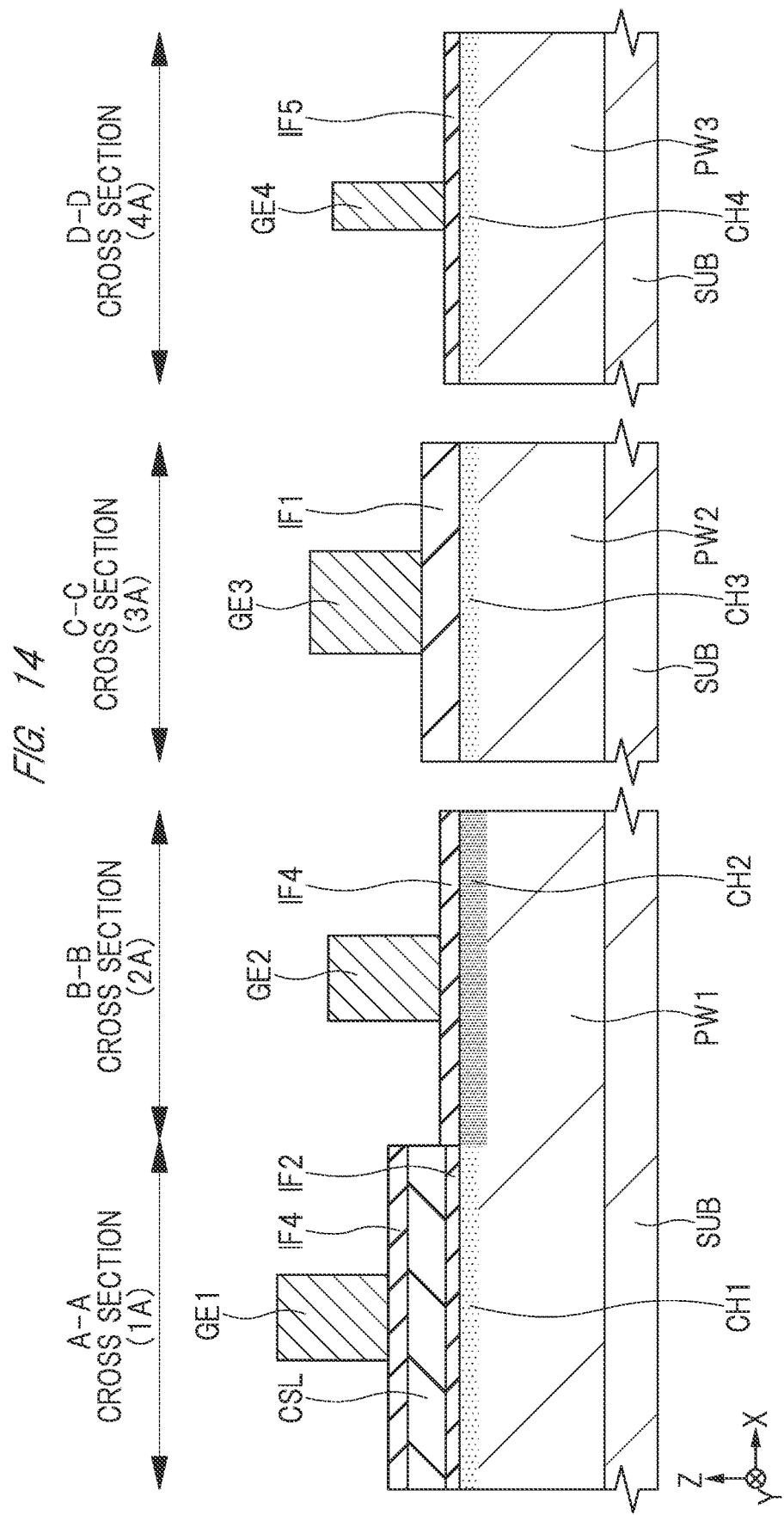
FIG. 14 is a cross-sectional view showing the process for manufacturing the semiconductor device subsequent to FIG. 13.

Next, as shown in FIG. 14, each of the gate electrodes GE1 to GE4 is formed in each of the regions 1A to 4A. First, for example, a polycrystalline silicon film is deposited as a conductive film for the gate electrodes by, for example, the CVD method so as to cover the regions 1A to 4A. Then, an n type impurity is introduced into the conductive film by the photolithography technique and the ion implantation method. Next, the conductive film is patterned by the photolithography technique and the dry etching method.

In this manner, the gate electrode GE1 of the memory transistor 1Q is formed on the insulating film IF4 in the region 1A, the gate electrode GE2 of the selection transistor 2Q is formed on the insulating film IF4 in the region 2A, the gate electrode GE3 of the high-withstand-voltage transistor 3Q is formed on the insulating film IF1 in the region 3A, and the gate electrode GE4 of the low-withstand-voltage transistor 4Q is formed on the insulating film IF5 in the region 4A.

Thereafter, each of the transistors 1Q to 4Q shown in FIG. 15 is formed through the following various processes.

First, each insulating film exposed from each of the gate electrodes GE1 to GE4 is removed by performing the dry etching process and the wet etching process to the exposed insulating film.

Consequently, the insulating film IF4, the insulating film CSL and the insulating film IF2 left under the gate electrode GE1 in the region 1A become the gate insulating film GI1. Also, the insulating film IF4 left under the gate electrode GE2 in the region 2A becomes the gate insulating film GI2, the insulating film IF1 left under the gate electrode GE3 in the region 3A becomes the gate insulating film GI3, and the insulating film IF5 left under the gate electrode GE4 in the region 4A becomes the gate insulating film GI4.

Next, the n type extension region EX is formed in the semiconductor substrate SUB on both sides or each of the gate electrodes GE1 to GE4 by the photolithography technique and the ion implantation method.

Next, an insulating film made of, for example, silicon nitride is formed by, for example, the CVD method so as to cover each of the gate electrodes GE1 to GE4 in each of the regions 1A to 4A. Subsequently, by performing the anisotropic etching to this insulating film, the sidewall spacer SW is formed on each side surface of each of the gate electrodes GE1 to GE4.

Next, the n type diffusion region DR is formed in the semiconductor substrate SUB on both sides of each of the gate electrodes GE1 to GE4 via the sidewall spacer SW by the photolithography technique and the ion implantation method.

Next, the silicide layer SI is formed on each upper surface of the gate electrodes GE1 to GE4 and the diffusion region DR by the salicide (Self Aligned Silicide) technique. The silicide layer SI can be formed by reacting the materials composing the gate electrodes GE1 to GE4 and the semiconductor substrate SUB with the metal film. The metal film is made of, for example, cobalt, nickel or nickel-platinum alloy, and the silicide layer SI is made of, for example, cobalt silicide ($CoSi_2$), nickel silicide (NiSi) or nickel platinum silicide (NiPtSi).

The semiconductor device according to the first embodiment is manufactured in the manner described above.

Here, the relationship in the thickness of each of the gate insulating films GI2 to GI4 will be summarized. In the first embodiment, at the time of the manufacturing process of FIG. 14, the thickness of the insulating film IF1 in the region 3A is larger than each of the thickness of the insulating film IF4 in the region 2A and the thickness of the insulating film IF5 in the region 4A. Also, the thickness of the insulating film IF4 in the region 2A is larger than the thickness of the insulating film IF5 in the region 4A. Namely, the thickness of the gate insulating film GI3 is larger than each of the thickness of the gate insulating film GI2 and the thickness of the gate insulating film GI4, and the thickness of the gate insulating film GI2 is larger than the thickness of the gate insulating film GI4.

Main Feature of First Embodiment

In Patent Document 1 described above, the gate insulating film GI1 and the gate insulating film GI2 are processed at the boundary portion between the memory transistor 1Q (region 1A) and the selection transistor 2Q (region 2A), and there is fear that the gate insulating film GI1 or the gate insulating film GI2 is left in the boundary portion. Namely, in Patent Document 1 described above, the gate insulating film for the memory transistor and the gate insulating film for the selection transistor are completed in different manufacturing processes. Thus, in order to resolve such a fear and promote the miniaturization of the semiconductor device, for example, the use of the ArF excimer laser is necessary, and there is the problem that the expensive exposure apparatus and the expensive exposure process are required.

On the other hand, in the first embodiment, after the insulating film IF3, the insulating film CSL and the insulating film IF2 in the region 2A are removed by the manufacturing process of FIG. 6 to FIG. 8, the insulating film IF4 is formed on the insulating film CSL in the region 1A and on the semiconductor substrate SUB in the region 2A by the manufacturing process of FIG. 9. Namely, in the first embodiment, the gate insulating film GI1 of the memory transistor 1Q (region 1A) and the gate insulating film GI2 of the selection transistor 2Q (region 2A) are completed in the same process. In other words, the processing at the boundary portion is performed only once. Therefore, it is possible to reduce the fear that the insulating film composing the gate insulating film GI1 or the gate insulating film GI2 is left at the boundary portion. Accordingly, the reliability of the semiconductor device can be improved.

Also, the use of the expensive ArF excimer laser for resolving such a fear is not required. For example, the resist patterns RP1 to RP4 used in the first embodiment are formed using the KrF excimer laser. Therefore, it possible to suppress the increase in the manufacturing cost of the semiconductor device. Also, according to the manufacturing method described with reference to FIG. 2 to FIG. 15, the miniaturization of the semiconductor device can be achieved without using the expensive exposure apparatus and the expensive exposure process.

Further in Patent Document 2 described above, the oxidation treatment by the RTO method is performed after the oxidation treatment by the ISSG oxidation method (after forming the gate insulating film GI2), and thus, there is a problem that the retention characteristics of the memory transistor 1Q are degraded due to the thermal load of the oxidation treatment by the RTO method.

On the other hand, in the first embodiment, the gate insulating film GI1 is formed after the RTO method is used for forming the insulating film IF1 in FIG. 3. Therefore, since the problem as in Patent Document 2 does not occur, it is possible to improve the reliability of the semiconductor device.

Further, in the manufacturing method according to the first embodiment, as shown in FIG. 9, the insulating film IF4 to be the gate insulating film GI2 in the region 2A is simultaneously formed in the process of forming the insulating film IF4 to be part of the gate insulating film GI1. Therefore, it is possible to simplify the manufacturing process.

Incidentally, with the miniaturization of the semiconductor device, the performance improvement such as high speed operation and low power consumption has been demanded for the memory cell MC (memory transistor 1Q, selection transistor 2Q) and the low-withstand-voltage transistor 4Q. Meanwhile, it is necessary for the high-withstand-voltage transistor 3Q to ensure the withstand voltage rather than the high speed operation and the low power consumption due to its nature of being used for the I/O circuit or the like.

In Patent Document 1 and Patent Document 2, since the gate insulating film GI2 of the selection transistor 2Q is formed in the same process as the gate insulating film GI3 of the high-withstand-voltage transistor 3Q, the gate insulating film GI2 is a relatively thick insulating film. Also, in Patent Document 1 and Patent Document 2, the thickness of the gate insulating film GI2 of the selection transistor 2Q is the same as the thickness of the gate insulating film GI3 of the high-withstand-voltage transistor 3Q. Therefore, it is difficult to improve the performance of the selection transistor 2Q.

On the other hand, in the first embodiment, the gate insulating film GI2 of the selection transistor 2Q is the insulating film IF4 and is a relatively thin insulating film. Namely, the thickness of the gate insulating film GI2 of the selection transistor 2Q is smaller than the thickness of the gate insulating film GI3 of the high-withstand-voltage transistor 3Q. Here, in recent years, not only the miniaturization of the semiconductor device but also the low power consumption has been demanded. For example, the gate length of the field effect transistor is 45 nm or less (45 nm or more in conventional art) and the operational voltage is 2.5 V or lower (2.5 V or higher in conventional art). Therefore, in the semiconductor device taking the low power consumption into consideration, it is not always necessary that the gate insulating film GI2 of the selection transistor 2Q is formed to have a relatively large thickness as in Patent Document 1 and Patent Document 2. Consequently, from the viewpoint of improving performance such as high speed operation and low power consumption, the semiconductor device according to the first embodiment is superior to the semiconductor devices of Patent Document 1 and Patent Document 2.

Figure 16:
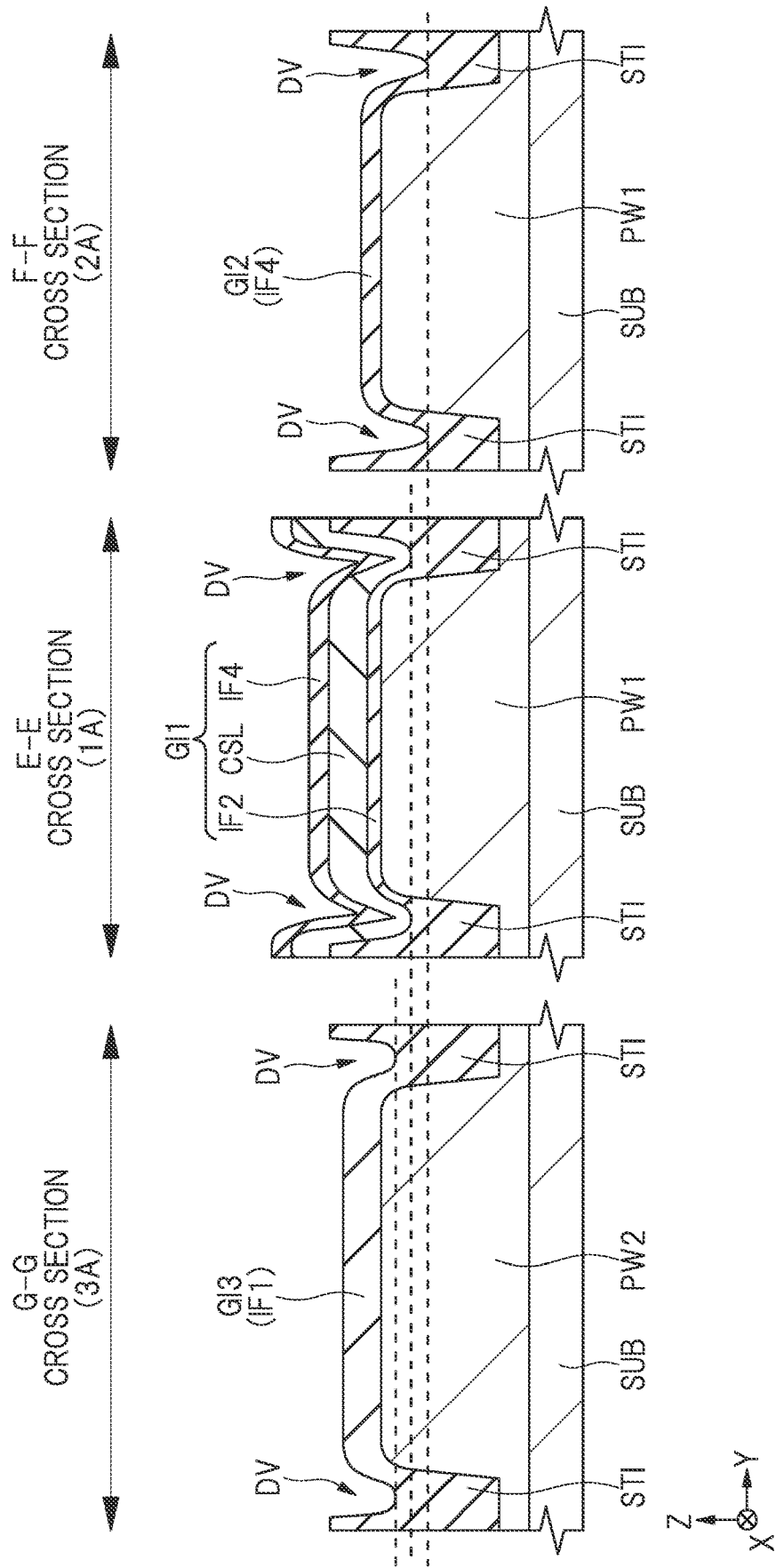
FIG. 16 is a cross-sectional view showing the semiconductor device in FIG. 13 seen from a different direction.

FIG. 16 is a cross-sectional view of the semiconductor device at the time when the manufacturing process of FIG. 13 ends, and it shows the cross-sectional views along the E-E line, the F-F line and G-G line in FIG. 1.

Though not described in detail, the process of cleaning the main surface of the semiconductor substrate SUB is performed many times during the manufacturing process shown in FIG. 2 to FIG. 15. For example, after the ion implantation or the removal of the resist patterns RP1 to RP4, the main surface of the semiconductor substrate SUB is cleaned by the cleaning solution containing hydrofluoric acid and hydrogen peroxide. Also, in the process of removing the silicon oxide film, the wet etching process using the solution containing hydrofluoric acid is performed.

By these cleaning process and wet etching process, the upper surface of the element isolation portion STI is gradually recessed. Further, on the upper surface of the element isolation portion STI, a divot (dent) DV provided at the time of forming the element isolation portion STI is present around the boundary between the element isolation portion STI and the active region of the semiconductor substrate SUB.

In each of the manufacturing processes of FIG. 2 to FIG. 15, the state of the insulating film covering the divot DV is different in each of the regions 1A to 3A. Therefore, as shown by the broken line in FIG. 16, the depth of the divot DV is different in each of the regions 1A to 3A. It can be seen that the depth of the divot DV becomes deeper in the order of the region 3A, the region 1A and the region 2A when the manufacturing method of the first embodiment is applied.

Second Embodiment

The method of manufacturing the semiconductor device according to the second embodiment will be described below with reference to FIG. 17 to FIG. 26. In the following description, the difference from the first embodiment will be mainly described and the description of the points overlapping with the first embodiment will be omitted.

In the second embodiment, the transistors 1Q to 4Q are manufactured by the manufacturing process different from that of the first embodiment. The manufacturing process of the second embodiment is the same as that of the first embodiment up to FIG. 3. After the manufacturing process of FIG. 3, the manufacturing process of FIG. 17 performed.

Since the thicknesses of the insulating films IF1 to IF4 and the insulating film CSL in the second embodiment are the same as those of the first embodiment, the description thereof will be omitted.

Figure 17:
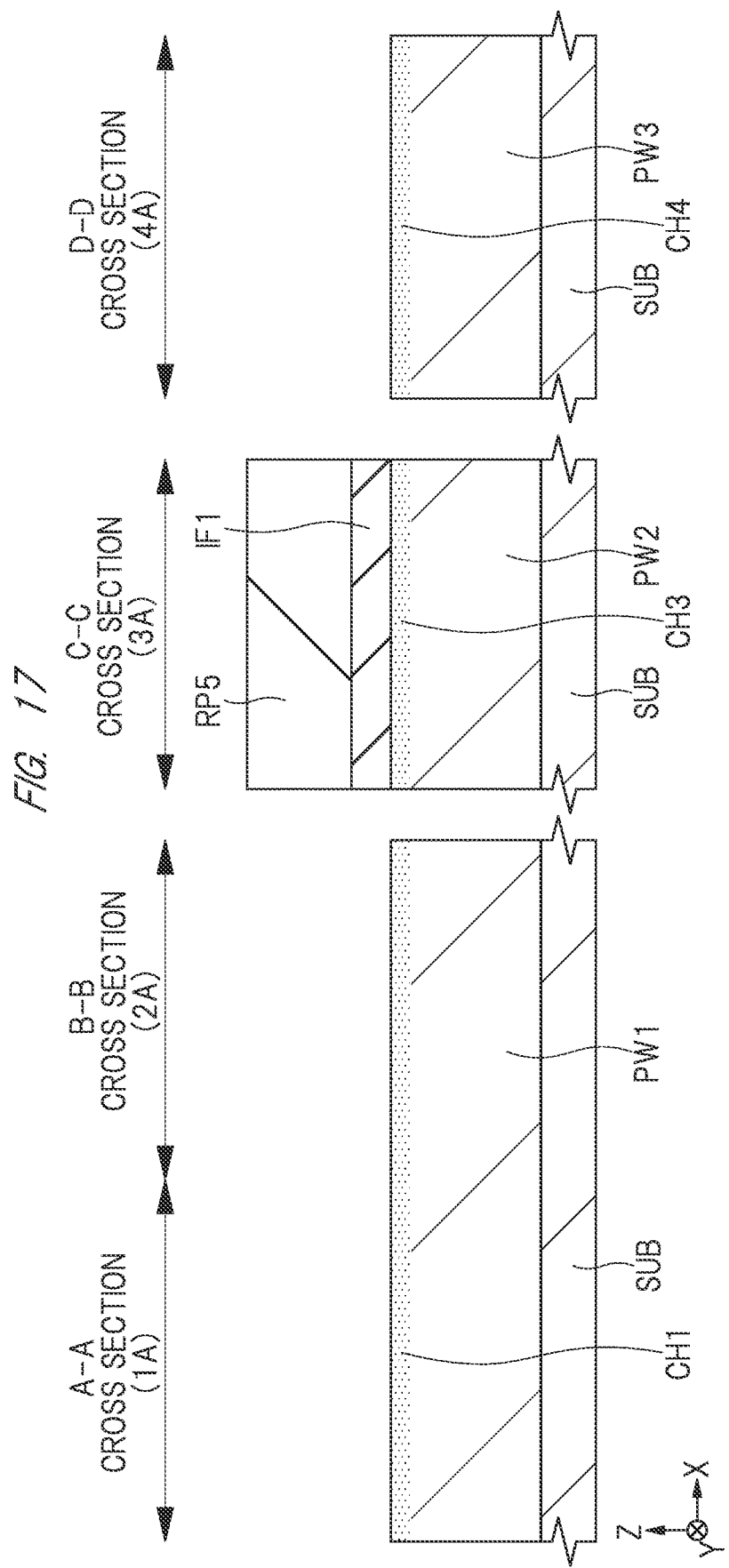
FIG. 17 is a cross-sectional view showing a process for manufacturing a semiconductor device according to the second embodiment.

As shown in FIG. 17, a resist pattern RP5 having an opening pattern exposing the region 1A, the region 2A and the region 4A so as to cover the region 3A is formed on the insulating film IF1. Next, ion implantation for adjusting the threshold of the memory transistor 1Q is performed using the resist pattern RP5 as a mask, thereby forming the channel region CH1 in the surface of the well region PW1 in each of the region 1A and the region 2A.

Next, the insulating film IF1 in each of the region 1A, the region 2A and the region 4A is selectively removed using the resist pattern RP5 as a mask by, for example, the wet etching process using a solution containing hydrofluoric acid. Thereafter, the resist pattern RP5 is removed by, for example, the asking treatment.

Here, since the resist pattern RP5 can be used in both the process of forming the channel region CH1 and the process of removing the insulating film IF1, the number of masks can be reduced.

Figure 18:
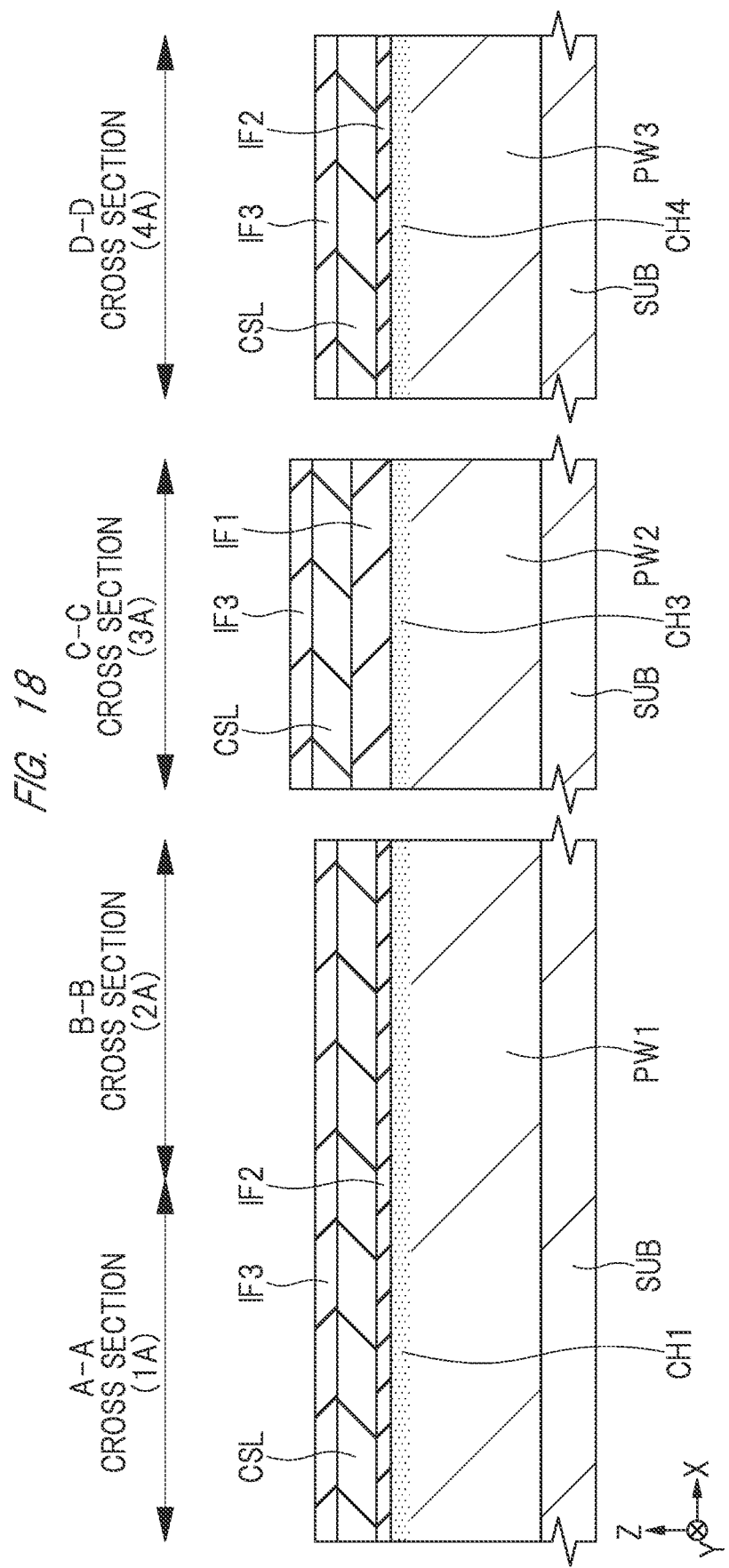
FIG. 18 is a cross-sectional view showing the process for manufacturing the semiconductor device subsequent to FIG. 17.

Next, as shown in FIG. 18, the insulating film IF2 made of, for example, silicon oxide is formed on the semiconductor substrate SUB in each of the region 1A, the region 2A and the region 3A by, for example, the thermal oxidation method. By this oxidation treatment, the semiconductor substrate SUB in the region 3A is slightly oxidized and the thickness of the insulating film IF1 slightly increases.

Next, the insulating film CSL made of, for example, silicon nitride is formed on the insulating film IF2 in each of the region 1A, the region 2A and the region 4A and on the insulating film IF1 in the region 3A by, for example, the CVD method or the ALD method. Next, the insulating film IF3 made of, for example, silicon oxide is formed on the insulating film CSL in each of the regions 1A to 4A by, for example, the CVD method.

Figure 19:
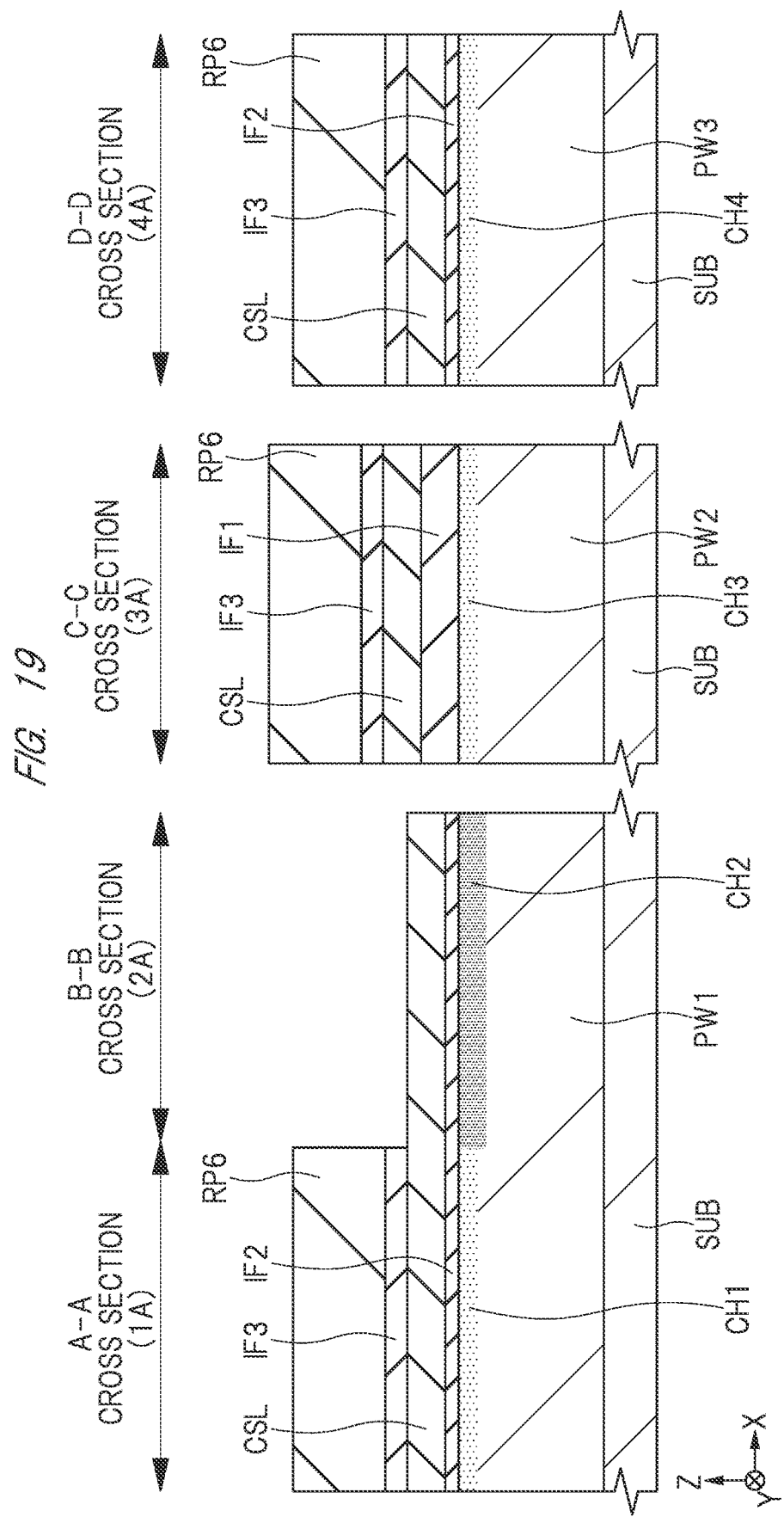
FIG. 19 is a cross-sectional view showing the process for manufacturing the semiconductor device subsequent to FIG. 18.

Next, as shown in FIG. 19, a resist pattern RP6 having an opening pattern exposing the region 2A so as to cover the region 1A, the region 3A and the region 4A is formed on the insulating film IF3. Next, ion implantation for adjusting the threshold of the selection transistor 2Q is performed using the resist pattern RP6 as a mask, thereby forming the channel region CH2 in the surface of the well region PW1 in the region 2A.

Next, the insulating film IF3 in the region 2A is selectively removed using the resist pattern RP6 as a mask by, for example, the wet etching process using a solution containing hydrofluoric acid. Thereafter, the resist pattern RP6 is removed by, for example, the ashing treatment.

Here, since the resist pattern RP6 can be used in both the process of forming the channel region CH2 and the process of removing the insulating film IF3, the number of masks can be reduced. Note that either the process of forming the channel region CH2 or the process of removing the insulating film IF3 may be performed first.

Figure 20:
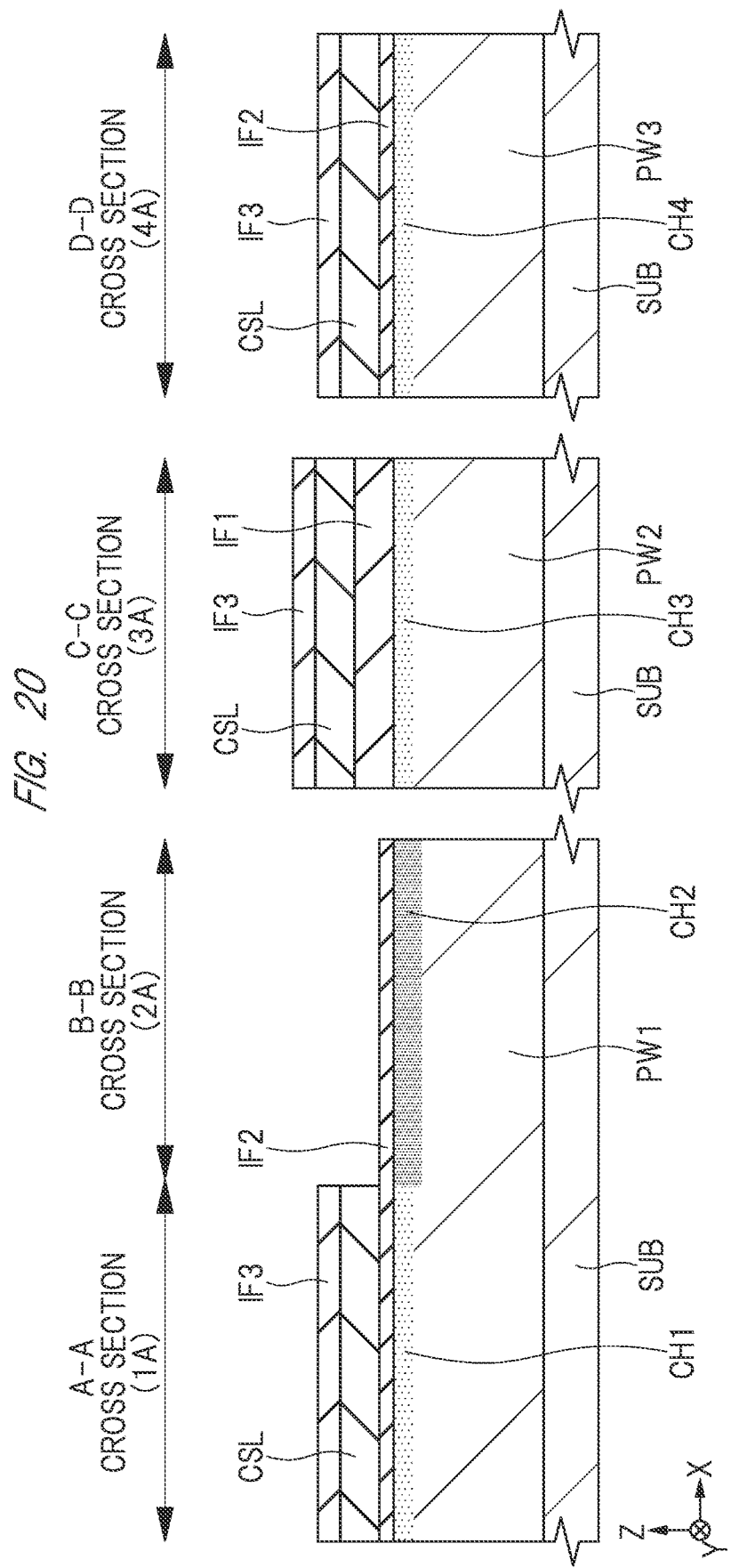
FIG. 20 is a cross-sectional view showing the process for manufacturing the semiconductor device subsequent to FIG. 19.

Next, as shown in FIG. 20, the insulating film CSL in the region 2A is selectively removed using the insulating film IF3 in each of the region 1A, the region 3A and the region 4A as a mask by, for example, the wet etching process using a solution containing phosphoric acid.

Figure 21:
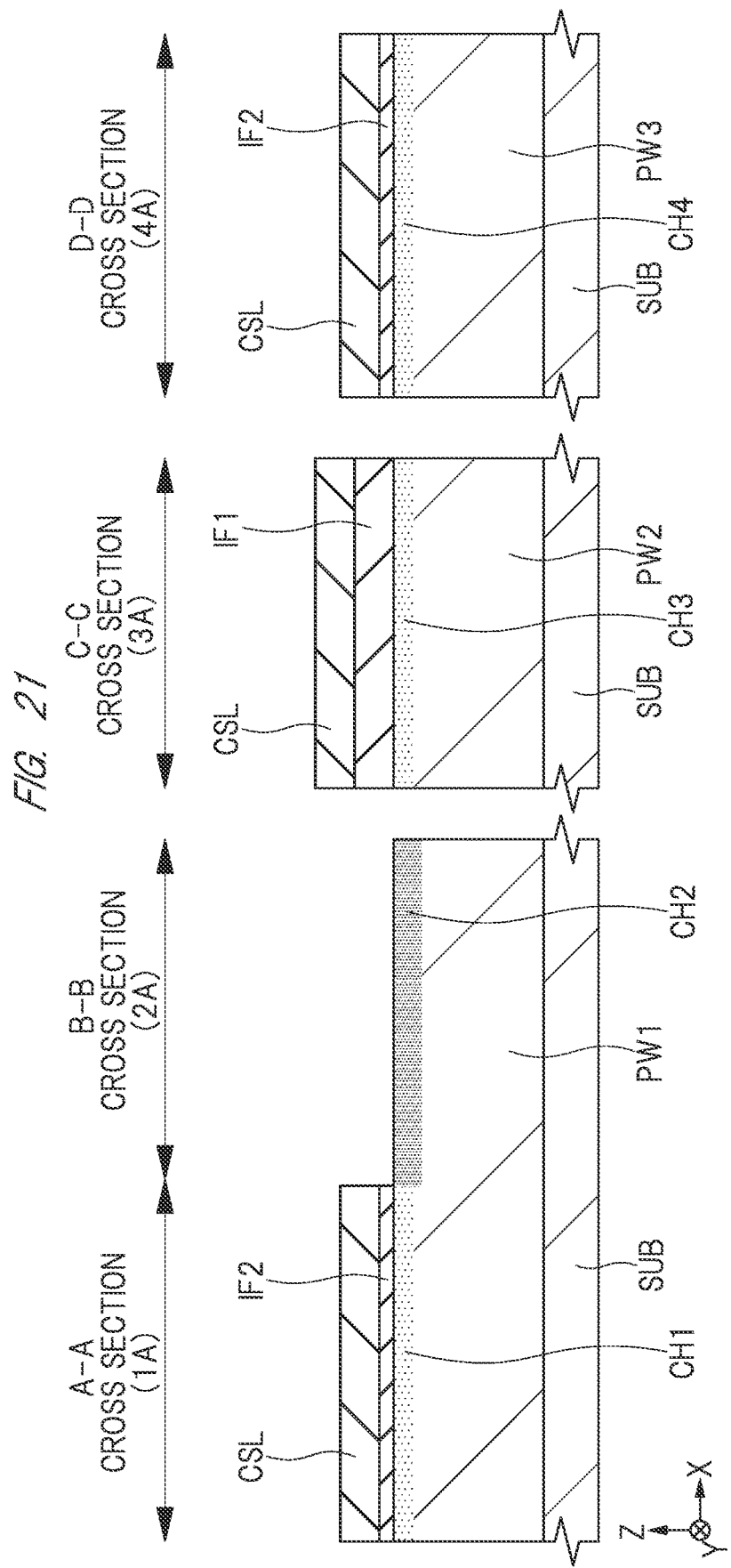
FIG. 21 is a cross-sectional view showing the process for manufacturing the semiconductor device subsequent to FIG. 20.

Next, as shown in FIG. 21, the insulating film IF2 in the region 2A is selectively removed by, for example, the wet etching process using a solution containing hydrofluoric acid. At this time, the insulating film IF3 in each of the region 1A, the region 3A and the region 4A is also removed.

Figure 22:
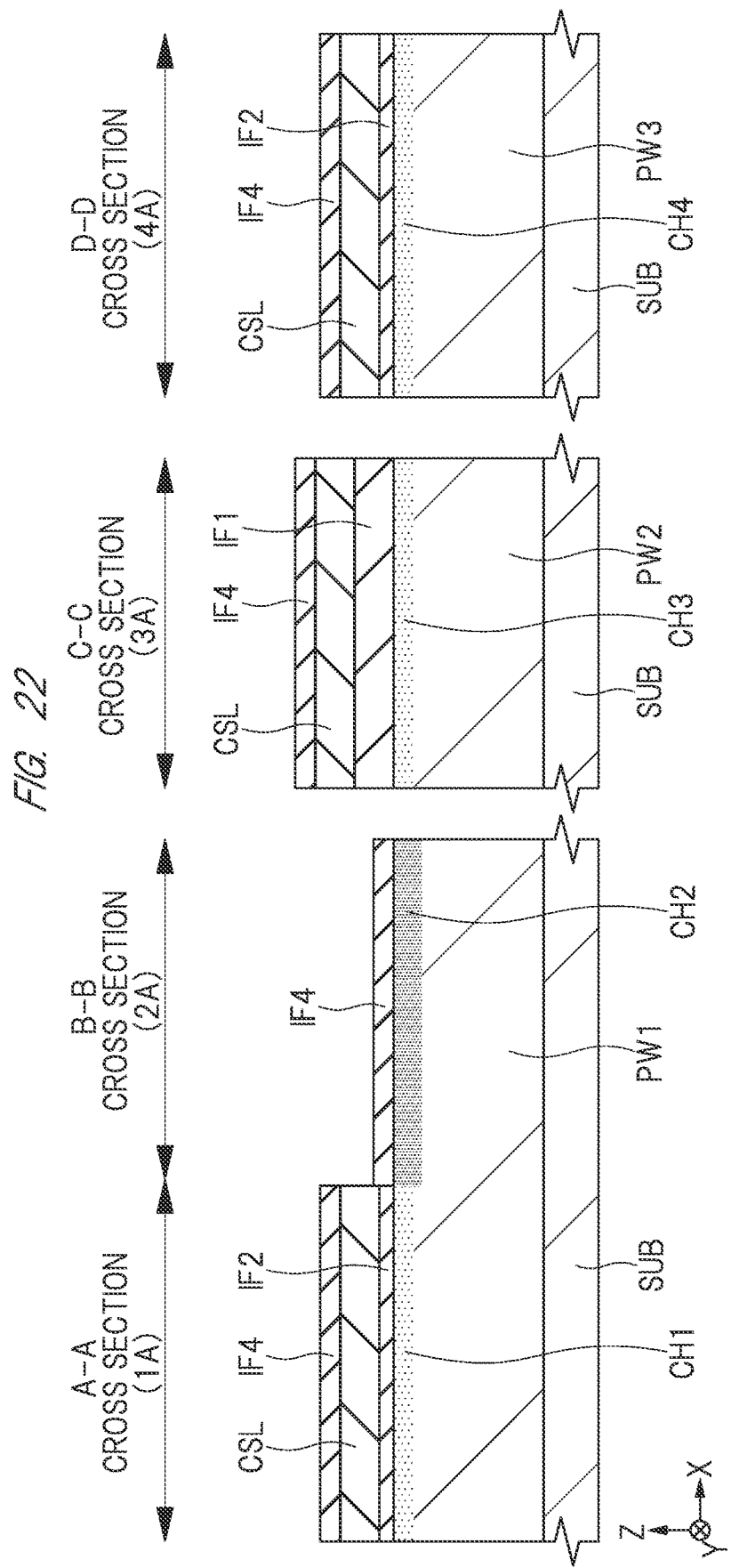
FIG. 22 is a cross-sectional view showing the process for manufacturing the semiconductor device subsequent to FIG. 21.

Next, as shown in FIG. 22, the insulating film IF4 is formed on the insulating film CSL in each of the region 1A, the region 3A and the region 4A and on the semiconductor substrate SUB in the region 2A by, for example, the ISSG oxidation method.

Figure 23:
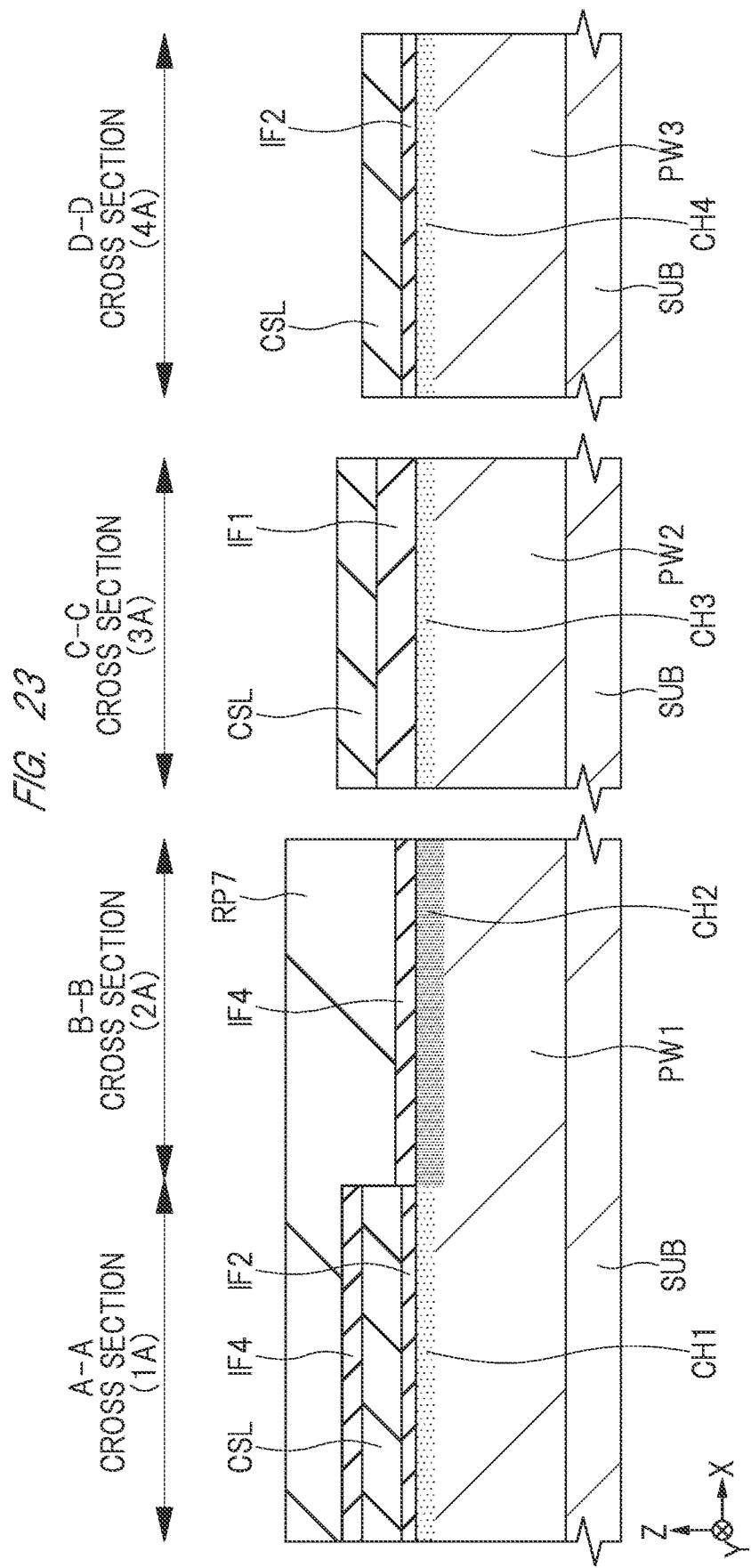
FIG. 23 is a cross-sectional view showing the process for manufacturing the semiconductor device subsequent to FIG. 22.

Next, as shown in FIG. 23, a resist pattern RP7 having an opening pattern exposing the region 3A and the region 4A so as to cover the region 1A and the region 2A is formed on the insulating film IF4.

Next, the insulating film IF4 in the region 3A and the region 4A is selectively removed using the resist pattern RP7 as a mask by, for example, the wet etching process using a solution containing hydrofluoric acid. Then, the resist pattern RP7 is removed by, for example, the ashing treatment.

Figure 24:
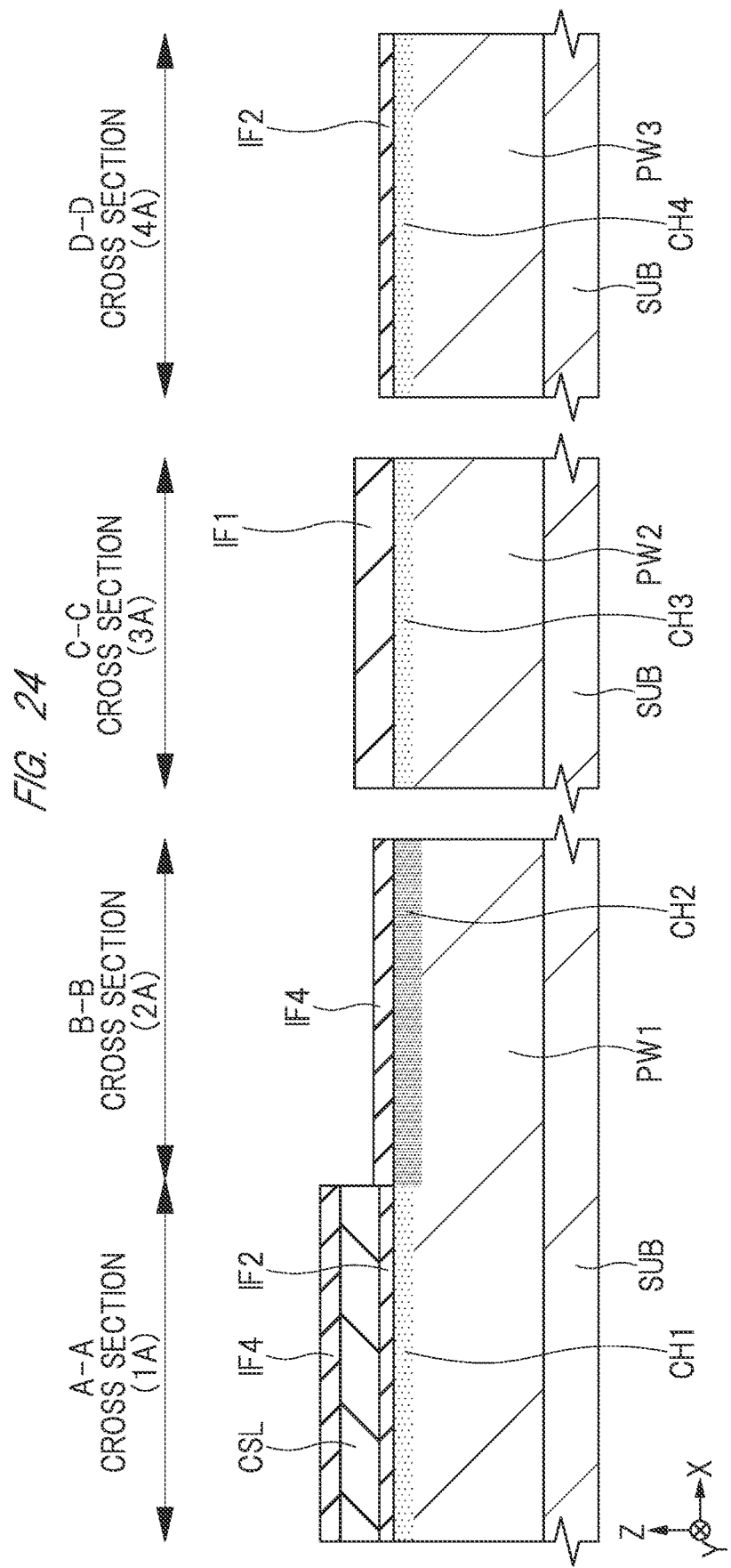
FIG. 24 is a cross-sectional view showing the process for manufacturing the semiconductor device subsequent to FIG. 23.

Next, as shown in FIG. 24, the insulating film CSL in the region 3A and the region 4A is selectively removed using the insulating film IF4 in the region 1A and the region 2A as a mask by, for example, the wet etching process using a solution containing phosphoric acid.

Figure 25:
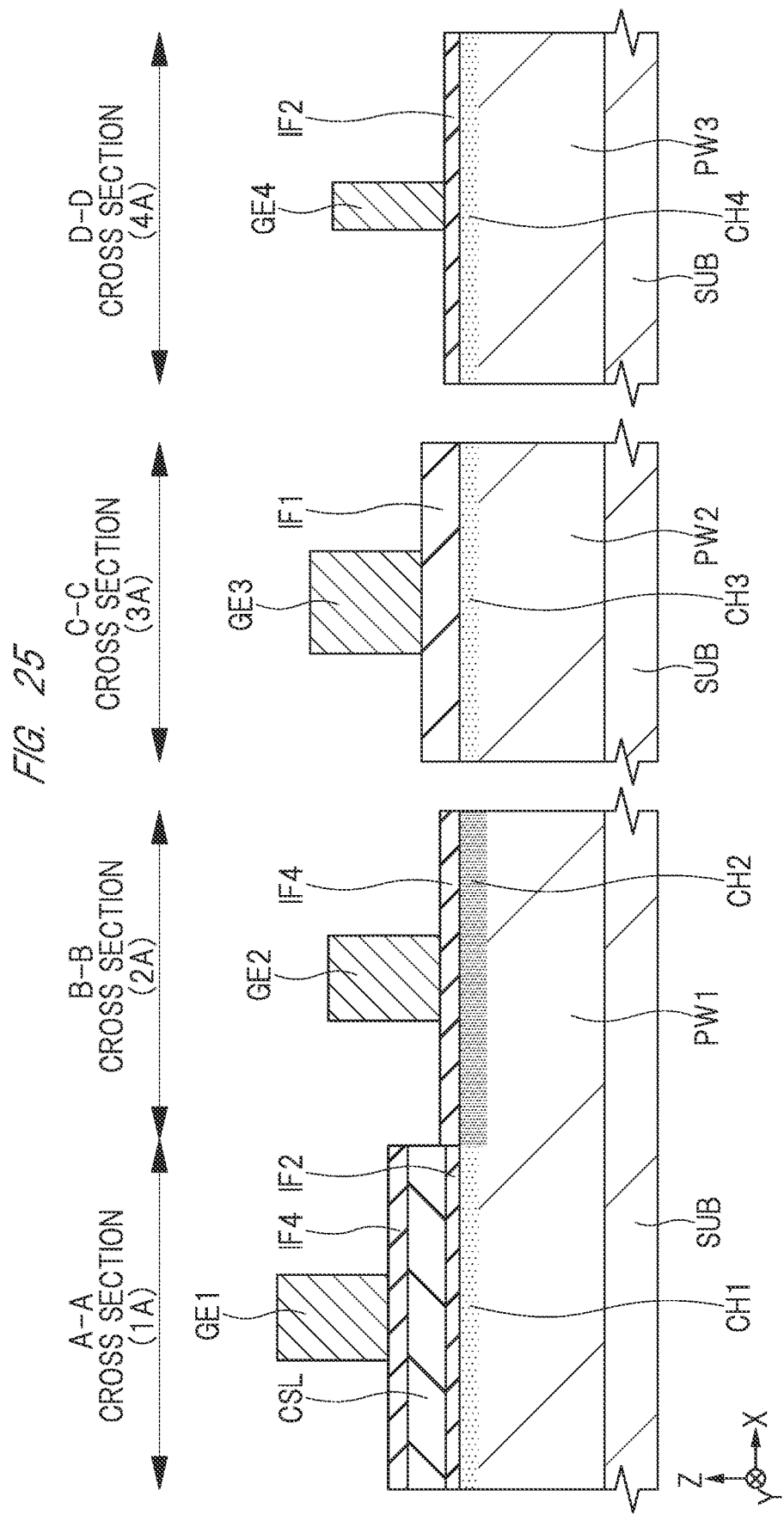
FIG. 25 is a cross-sectional view showing the process for manufacturing the semiconductor device subsequent to FIG. 24.

Next, as shown in FIG. 25, each of the gate electrodes GE1 to GE4 is formed in each of the regions 1A to 4A by the same method as that of the first embodiment.

In this manner, the gate electrode GE1 of the memory transistor 1Q is formed on the insulating film IF4 in the region 1A, the gate electrode GE2 of the selection transistor 2Q is formed on the insulating film IF4 in the region 2A, the gate electrode GE3 of the high-withstand-voltage transistor 3Q is formed on the insulating film IF1 in the region 3A, and the gate electrode GE4 of the low-withstand-voltage transistor 4Q is formed on the insulating film IF2 in the region 4A.

Figure 26:
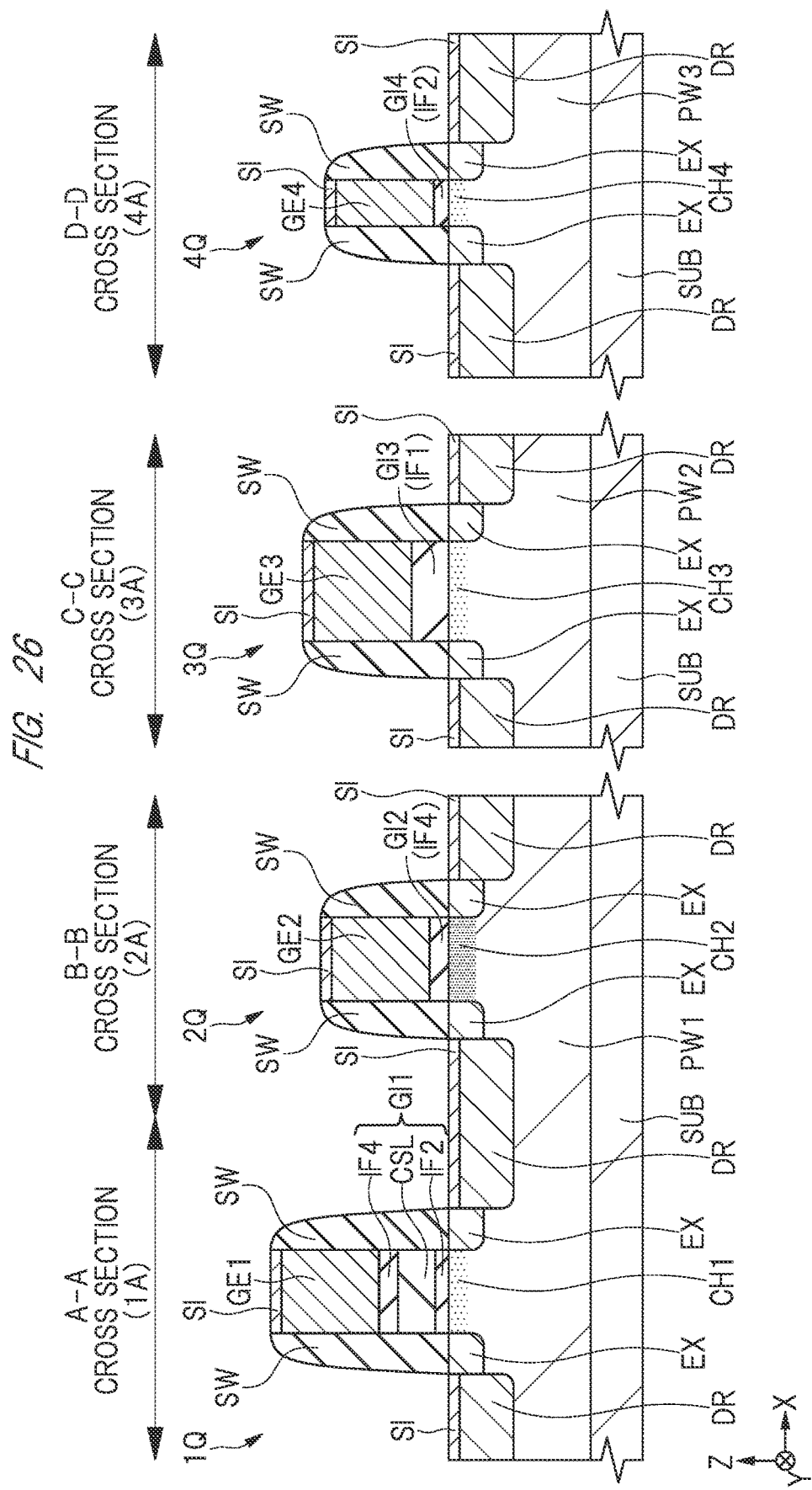
FIG. 26 is a cross-sectional view showing the process for manufacturing the semiconductor device subsequent to FIG. 25.

Thereafter, each of the transistors 1Q to 4Q shown in FIG. 26 is formed through the same manufacturing process as that of the first embodiment shown in FIG. 15.

The relationship in the thickness of each of the gate insulating films GI2 to GI4 in the second embodiment will be described below. In the second embodiment, at the time of the manufacturing process of FIG. 25, the thickness of the insulating film IF1 in the region 3A is larger than each of the thickness of the insulating film IF4 in the region 2A and the thickness of the insulating film IF2 in the region 4A. Also, the thickness of the insulating film IF4 in the region 2A is larger than the thickness of the insulating film IF2 in the region 4A. Namely, the thickness of the gate insulating film GI3 is larger than each of the thickness of the gate insulating film GI2 and the thickness of the gate insulating film GI4, and the thickness of the gate insulating film GI2 is larger than the thickness of the gate insulating film GI4.

The method of manufacturing a semiconductor device according to the second embodiment can obtain the same effect as that of the first embodiment and can simplify the manufacturing process. This is because, unlike the first embodiment, the gate insulating film GI4 in the region 4A in the second embodiment is composed of the insulating film IF2 composing the gate insulating film GI1 of the memory transistor 1Q. Namely, the gate insulating film GI4 in the region 4A can be formed by the same process as the process of forming the insulating film IF2 which is part of the gate insulating film GI1 in the region 1A.

Further, the thickness of the insulating film IF2 is preferably designed by giving priority to the characteristics of the memory transistor 1Q. Therefore, for example, the case in which the thickness of the gate insulating film GI4 is too small to satisfy the characteristics required for the low-withstand-voltage transistor 4Q is assumed. However, in such a case, by forming a high-dielectric-constant film on the insulating film IF2 in the region 4A, the gate insulating film GI4 composed of the insulating film IF2 and the high-dielectric-constant film can be formed.

For example, the high-dielectric-constant film can be formed through the following manufacturing process.

First, after the manufacturing process of FIG. 24, the high-dielectric-constant film is formed on the insulating film IF4 in each of the region 1A and the region 2A, on the insulating film IF1 in the region 3A, and on the insulating film IF2 in the region 4A by, for example, the CVD method or the ALD method. Next, a resist pattern having an opening pattern exposing the region 1A, the region 2A and the region 3A so as to cover the region 4A is formed.

Next, the high-dielectric-constant film in each of the region 1A, the region 2A and the region 3A is selectively removed using the resist pattern as a mask by, for example, the dry etching process. Then, the resist pattern is removed by, for example, the ashing treatment. The subsequent manufacturing process is the same as that in FIG. 25 and thereafter.

Note that the high-dielectric-constant film has a dielectric constant higher than that of the silicon oxide film and is made of a metal oxide film. As the metal oxide film, for example, a hafnium oxide film ($HfO_2$ film), a hafnium silicate film (HfSiO film), an aluminum oxide film ($Al_2O_3$ film), a tantalum oxide film ($Ta_2O_5$ film), a zirconium oxide film ($ZrO_2$ film) or a stacked film of these films can be applied.

(First Modification)

As the first modification of the first embodiment and the second embodiment, the technique of adopting an SOI (Silicon On Insulator) substrate in the region 4A can be presented. In this case, the low-withstand-voltage transistor 4Q is formed on the SOI substrate.

The SOI substrate includes a semiconductor substrate SUB as a support substrate, an insulating layer BOX formed on the semiconductor substrate SUB and a semiconductor layer SL formed on the insulating layer BOX. The insulating layer BOX is made of, for example, silicon oxide, and the thickness of the insulating layer BOX is, for example, 10 nm to 20 nm. The semiconductor layer SL is made of single crystal silicon, and the thickness of the semiconductor layer SL is, for example, 10 nm to 20 nm.

The manufacturing method in the case of adopting such an SOI substrate is as follows.

Figure 27:
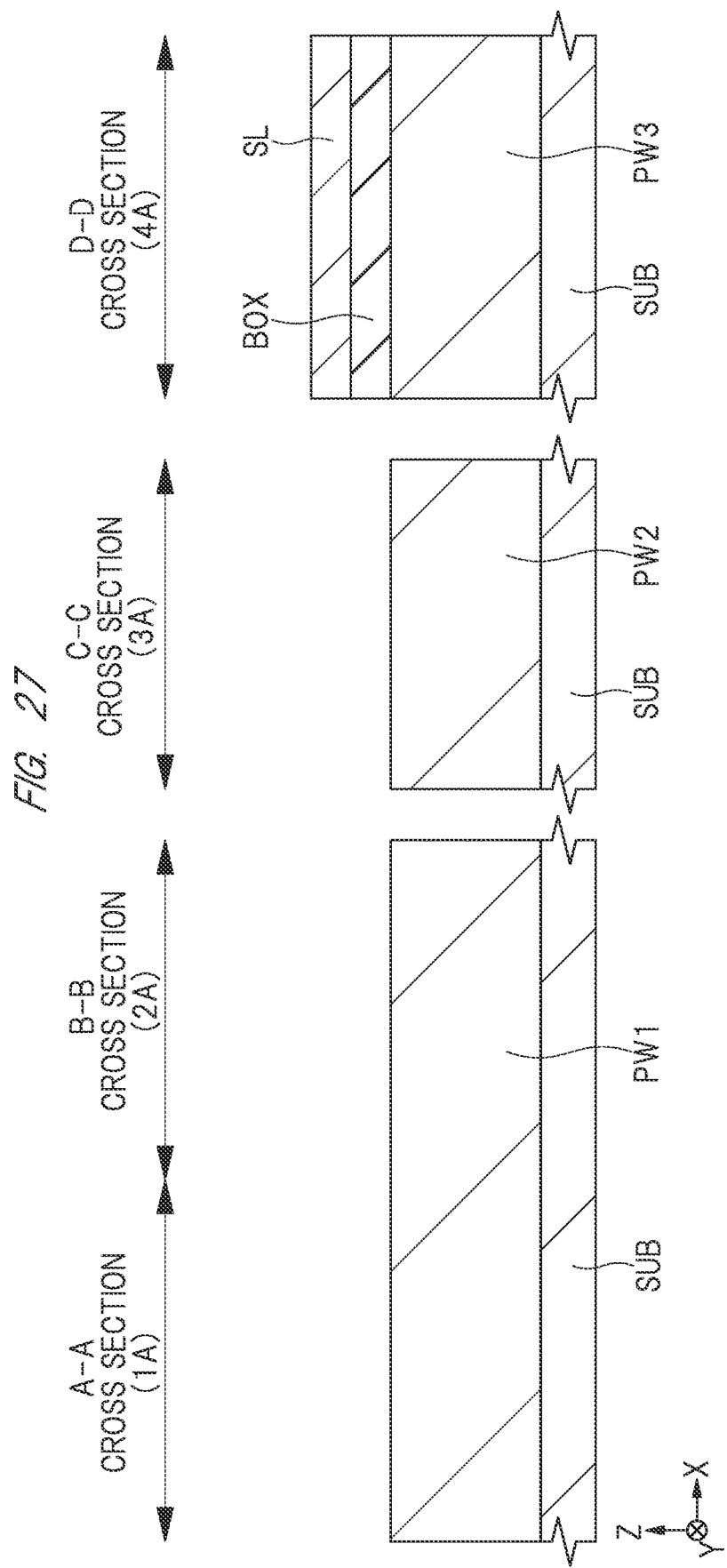
FIG. 27 is a cross-sectional view showing a semiconductor device according to the first modification.

First, before the manufacturing process in FIG. 2, the above-described SOI substrate is prepared. Next, as shown in FIG. 27, the semiconductor layer SL and the insulating layer BOX in each of the region 1A, the region 2A and the region 3A are selectively removed by the photolithography technique and the etching process such as the dry etching process or the wet etching process. As a result, the semiconductor substrate SUB in each of the region 1A, the region 2A and the region 3A is exposed, and the semiconductor layer SL and the insulating layer BOX are left on the semiconductor substrate SUB in the region 4A.

Thereafter the manufacturing process shown in FIG. 2 to FIG. 15 in the first embodiment or the manufacturing process shown in FIG. 17 to FIG. 26 in the second embodiment is performed. Therefore, each insulating film formed in the region 4A is formed on the semiconductor layer SL located above the semiconductor substrate SUB. For example, the insulating film IF1 is formed on the semiconductor layer SL in the region 4A in the manufacturing process shown in FIG. 3, the insulating film IF5 is formed on the semiconductor layer SL in the region 4A in the manufacturing process shown in FIG. 13, and the insulating film IF2 is formed on the semiconductor layer SL in the region 4A in the manufacturing process shown in FIG. 18.

(Second Modification)

As the second modification of the first embodiment and the second embodiment, the technique of composing the memory transistor 1Q from another memory element different from the MONOS transistor can be presented.

As the different memory element, for example, a memory element having a memory film MF shown in FIG. 28 instead of the gate insulating film GI1 including the insulating film CSL serving as a charge storage layer can be adopted.

The memory film MF is a high-dielectric-constant film having a trap level and the high-dielectric-constant film is, for example, a hafnium silicate film (HfSiO film). As another example of the memory film MF, a ferroelectric film can be presented. The ferroelectric film is, for example, a BZT film composed as (Ba, Ca) $TiO_3$ or a PLZT film composed as $PbZrTiO_3$.

The memory film MF like this can be formed by the process replaced with the process of forming the insulating film CSL. Also, the thickness relationship of each of the gate insulating films GI2 to GI4 is the same as that of the first embodiment and the second embodiment.

In the foregoing, the present invention has been specifically described based the embodiments, but the present invention is not limited to the embodiments described above and can be variously modified within the range not departing from the gist thereof.

For example, it has been described that the insulating film IF1 is formed by the RTO method in the first embodiment, the second embodiment, the first modification and the second modification, but the insulating film IF1 may be formed by the ISSG oxidation method or by the combined use of the RTO method and the ISSG oxidation method.

What is claimed is:

1. A method of manufacturing a semiconductor device having a first region in which a memory transistor is to be formed, a second region in which a selection transistor for selecting the memory transistor is to be formed and which is adjacent to the first region, a third region in which a first field effect transistor is to be formed, and a fourth region in which a second field effect transistor is to be formed, comprising steps of:
    (a) forming a first insulating film on a semiconductor substrate in each of the first region, the second region, the third region and the fourth region;
    (b) after the (a), selectively removing the first insulating film in each of the first region and the second region;
    (c) after the (b), forming a second insulating film on the semiconductor substrate in each of the first region and the second region;
    (d) after the (c), forming a third insulating film having a trap level on the second insulating film in each of the first region and the second region and on the first insulating film in each of the third region and the fourth region;

(e) after the (d), selectively removing the third insulating film in the second region and the second insulating film in the second region;

(f) after the (e), forming a fourth insulating film on the third insulating film in each of the first region, the third region and the fourth region and on the semiconductor substrate in the second region;

(g) after the (f), selectively removing the fourth insulating film in each of the third region and the fourth region and the third insulating film in each of the third region and the fourth region;

(h) after the (g), selectively removing the first insulating film in the fourth region;

(i) after the (h), forming a fifth insulating film on the semiconductor substrate the fourth region; and (j) after the (i), forming a first gate electrode of the memory transistor on the fourth insulating film in the first region, forming a second gate electrode of the selection transistor on the fourth insulating film in the second region, forming a third gate electrode of the first field effect transistor on the first insulating film in the third region, and forming a fourth gate electrode of the second field effect transistor on the fifth insulating film in the fourth region.

2. The method of manufacturing the semiconductor device according to claim 1,
wherein, in the (j), a thickness of the first insulating film in the third region is larger than each of a thickness of the fourth insulating film in the second region and a thickness of the fifth insulating film in the fourth region, and the thickness of the fourth insulating film in the second region is larger than the thickness of the fifth insulating film in the fourth region.

3. The method of manufacturing the semiconductor device according to claim 1,
wherein each of the first insulating film, the second insulating film, the fourth insulating m and the fifth insulating film is a silicon oxide film, and
wherein the third insulating film is a silicon nitride film.

4. The method of manufacturing the semiconductor device according to claim 3,
wherein, in the (f), the fourth insulating film is formed by ISSG oxidation method.

5. The method of manufacturing the semiconductor device according to claim 4,
wherein, in the (a), the first insulating film is formed by RTO method.

6. The method of manufacturing the semiconductor device according to claim 3, further comprising a step of:
(k) after the (d) and before the (e), forming a sixth insulating film which is a silicon oxide film on the third insulating film in each of the first region, the second region, the third region and the fourth region,
wherein the (e) includes steps of:
  (e1) selectively removing the sixth insulating film in the second region;
  (e2) after the (e1), selectively removing the third insulating film in the second region by using the sixth insulating film in each of the first region, the third region and the fourth region as a mask; and
  (e3) after the (e2), removing the sixth insulating film in each of the first region, the third region and the fourth region and the second insulating film in the second region.

7. The method of manufacturing the semiconductor device according to claim 6,
wherein the (e1) includes steps of:
  (e11) forming a resist pattern having an opening pattern exposing the second region so as to cover the first region, the third region and the fourth region;
  (e12) after the (e11), performing ion implantation for adjusting a threshold of the selection transistor to the semiconductor substrate in the second region by using the resist pattern as a mask;
  (e13) after the (e11), selectively removing the sixth insulating film in the second region by using the resist pattern as a mask; and
  (e14) after the (e12) and the (e13), removing the resist pattern.

8. The method of manufacturing the semiconductor device according to claim 1, further comprising steps of:
(l) before the (a), providing an SOI substrate having the semiconductor substrate, an insulating layer formed on the semiconductor substrate and a semiconductor layer formed on the insulating layer; and
(m) after the (l) and before the (a), selectively removing the semiconductor layer in each of the first region, the second region and the third region and the insulating layer in each of the first region, the second region and the third region,
wherein each of the first insulating film in the fourth region formed in the (a) and the fifth insulating film in the fourth region formed in the (i) is formed on the semiconductor layer.

* * * * *